United States Patent [19]
Suzuki et al.

[11] Patent Number: 5,153,898
[45] Date of Patent: Oct. 6, 1992

[54] X-RAY REDUCTION PROJECTION EXPOSURE SYSTEM OF REFLECTION TYPE

[75] Inventors: Masayuki Suzuki, Atsugi; Noritaka Mochizuki, Yokohama; Setsuo Minami, Kawasaki; Shigetaro Ogura, Tama; Yasuaki Fukuda, Machida; Yutaka Watanabe, Atsugi; Yasuo Kawai, Shizuoka; Takao Kariya, Hino, all of Japan

[73] Assignee: Canon Kabushiki Kaisha, Tokyo, Japan

[21] Appl. No.: 841,298

[22] Filed: Feb. 28, 1992

Related U.S. Application Data

[63] Continuation of Ser. No. 633,179, Dec. 28, 1990, abandoned, which is a continuation of Ser. No. 420,750, Oct. 13, 1989, abandoned, which is a continuation of Ser. No. 70,779, Jul. 7, 1987, abandoned.

[30] Foreign Application Priority Data

| Jul. 11, 1986 | [JP] | Japan | 61-163068 |
| Jun. 15, 1987 | [JP] | Japan | 62-148611 |
| Jun. 15, 1987 | [JP] | Japan | 62-148612 |
| Jun. 15, 1987 | [JP] | Japan | 62-148613 |
| Jun. 15, 1987 | [JP] | Japan | 62-148614 |
| Jun. 15, 1987 | [JP] | Japan | 62-148615 |
| Jun. 15, 1987 | [JP] | Japan | 62-148616 |

[51] Int. Cl.$^5$ .............................. G21K 5/00
[52] U.S. Cl. ................................ 378/34; 378/43; 378/84
[58] Field of Search ............... 378/34, 43, 84; 250/492.2; 355/60; 350/619, 620, 622, 443

[56] References Cited

U.S. PATENT DOCUMENTS

| 3,527,526 | 9/1970 | Silvertooth | 350/620 |
| 4,302,079 | 11/1981 | White | 350/443 |
| 4,411,013 | 10/1983 | Takasu et al. | 378/34 |
| 4,682,037 | 7/1987 | Kosugi . | |
| 4,688,904 | 8/1987 | Hirose et al. | 350/443 |
| 4,701,035 | 10/1987 | Hirose . | |
| 4,705,940 | 11/1987 | Kohno . | |
| 4,748,477 | 5/1988 | Isohata et al. . | |
| 4,749,867 | 6/1988 | Matsushita et al. . | |
| 4,798,450 | 1/1989 | Suzuki | 350/505 |
| 5,003,567 | 3/1991 | Hawryluk et al. | 378/34 |

FOREIGN PATENT DOCUMENTS 0101426  6/1983  Japan .................................... 378/34

OTHER PUBLICATIONS

Hoh, et al., "Feasibility Study on the Extreme UV/Soft X-Ray Projection-Type Lithography", Bulletin of the Electrotechnical Laboratory, vol. 49, No. 12, Oct. 1985, pp. 46-54 and 78.

Journal of Imaging Science, vol. 30, No. 2, Mar./Apr. 1986, pp. 80-86; F. Cerrina: "X-ray imaging with synchrotron radiation".

Journal of Vacuum Science & Technology, vol. B3g, No. 1, 2nd series Jan./Feb., 1985, pp. 227-231; F. Cerrina et al.: "A synchroton radiation x-ray lithography beam line of novel design".

Nuclear Instruments & Methods in Physics Research, Section A, vol. A246-439; W. Schildkamp et al.: "Melium cooling of x-ray optics during synchroton heating", May 1986.

(List continued on next page.)

Primary Examiner—David P. Porta
Attorney, Agent, or Firm—Fitzpatrick, Cella, Harper & Scinto

[57] ABSTRACT

An X-ray exposure apparatus includes a stage for holding a mask having a pattern for circuit manufacturing, a stage for holding a wafer to be exposed to the pattern of the mask with X-rays, and a reflection reduction imaging system, disposed between the mask stage and the wafer stage, including a reflecting mirror arrangement, containing at least three, but not more than five, reflecting mirrors coated with multi-layer films for receiving X-rays from the mask and directing them to the wafer to expose the wafer to the pattern of the mask with the X-ray in a reduced scale.

71 Claims, 12 Drawing Sheets

OTHER PUBLICATIONS

Journal of Optics, vol. 15, No. 4A, Sep. 1984, pp. 270-280; F. Bridou et al.: "Etude preliminaire d'objectifs catadioptriques a rayons x utilisant la reflextion totale ou les multicouches pour le diagnostic des plasmas".

Review of Scientific Instr., vol. 50, No. 4, Apr. 1979, pp. 510-512; S. Madrix et al.: "Image reduction to submicrometer dimensions by asymmetric crystal reflection of x-rays".

N.T.I.S. Technical Notes, No. 8, part J, Aug. 1984, p. 590; J. H. Underwood et al.: "Normal-incidence soft-x-ray mirror".

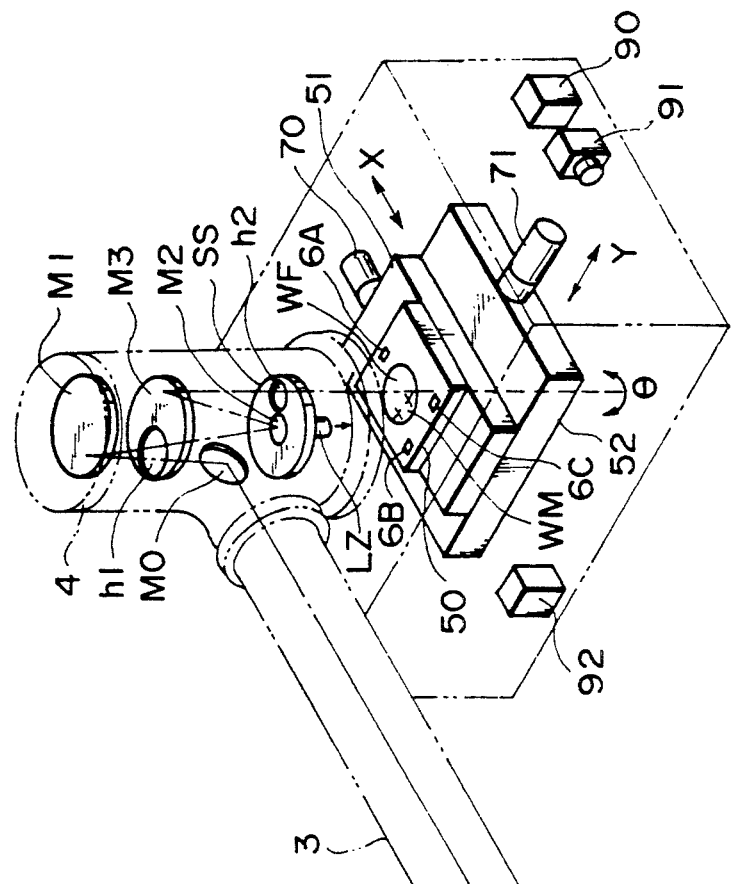
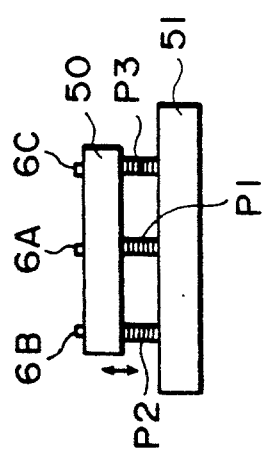
FIG. 15
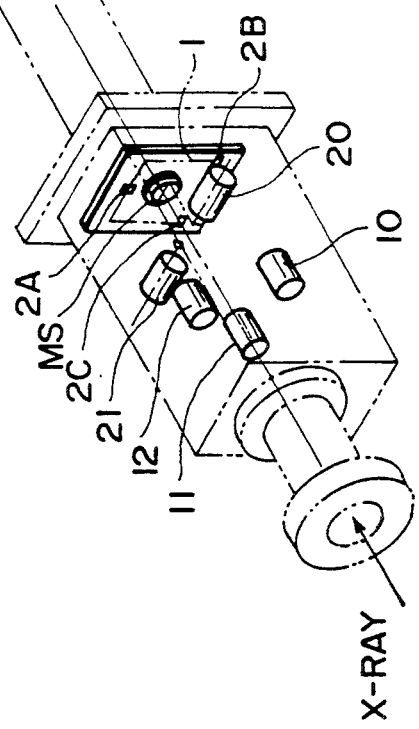
FIG. 14

X-RAY REDUCTION PROJECTION EXPOSURE SYSTEM OF REFLECTION TYPE

This application is a continuation of prior application, Ser. No. 07/633,179 filed Dec. 28, 1990, which application is a continuation of prior Ser. No. 07/420,750 filed Oct. 13, 1989, which application is a continuation of prior Ser. No. 07/070,779 filed Jul. 7, 1987, all now abandoned.

FIELD OF THE INVENTION AND RELATED ART

The present invention relates to a projection exposure apparatus, more particularly to an X-ray reduction projection exposure system of the reflection type and an X-ray reduction imaging system particularly usable for effecting high resolution printing.

In the field of semiconductor circuit manufacturing, exposure apparatuses such as mask aligners and steppers are widely used to print a circuit pattern from a mask or reticle onto a wafer.

The recent trend to the high density of the semiconductor chips such as IC and LSI increases the need for an exposure apparatus capable of very high resolution printing. Various researches and developments are being made to provide an exposure apparatus which can replace the recently used deep UV light. In general, in the exposure apparatuses of this type, more particularly to projection exposure apparatuses such as steppers, the minimum line width which is printable by the apparatus, represented by resolution power, is determined by wavelength of light used and a numerical aperture of the projection optical system.

As regards the numerical aperture, the resolution increases with increase of the numerical aperture, but the increase of the numerical aperture leads to shorter depth of focus, with the result that the image to be printed or transferred is blurred due to very small defocusing. For this reason, it is considered from the standpoint of optical design that obtaining high resolution by changing the numerical aperture is difficult. In view of this, efforts have been made to accomplish high resolution by using as the projection energy ray, a beam produced by an excimer laser or the like and X-rays which are relatively short in wavelength. Particularly, the X-ray exposure apparatus is expected as an exposure apparatus of the next generation, and an X-ray exposure apparatus in a proximity type has been proposed.

However, the currently proposed proximity type X-ray exposure is still not satisfactory in that the resolution is not enough for an ultra LSI such as 64 mega bit DRAM or higher density requiring very high resolution on the order of submicrons. Another problem is that a highly accurate pattern must be formed on a mask.

SUMMARY OF THE INVENTION

Accordingly, it is a principal object of the present invention to provide an X-ray reduction projection exposure system of reflection type and an X-ray reduction projection imaging system of reflection type, not the conventional proximity type.

It is another object of the present invention to provide an X-ray reduction projection exposure system of reflection type capable of printing images in high resolution on the order of submicrons.

It is a further object of the present invention to provide an X-ray reduction projection exposure system of reflection type capable of effecting printing in very high resolution.

According to an embodiment of the present invention, there is provided a system comprising means for directing X-rays to a mask and a projection imaging system for forming an image of a mask pattern in a predetermined reduced magnification or scale. Therefore, the pattern of the mask can be transferred in a reduced scale onto a wafer disposed at an imaging position by way of a projection exposure system.

These and other objects, features and advantages of the present invention will become more apparent upon consideration of the following description of the preferred embodiments of the present invention taken in conjunction with the accompanying drawings.

BRIEF DESCRIPTION OF THE DRAWINGS

FIG. 14 is a perspective view of an X-ray reduction projection exposure system of a reflection type according to a seventh embodiment of the present invention utilizing an imaging system shown in FIG. 9, 11 or 12.

FIG. 15 is an enlarged sectional view of a part of a wafer stage used with the FIG. 14 embodiment.

DESCRIPTION OF THE PREFERRED EMBODIMENTS

EMBODIMENT 1

Figure 1:
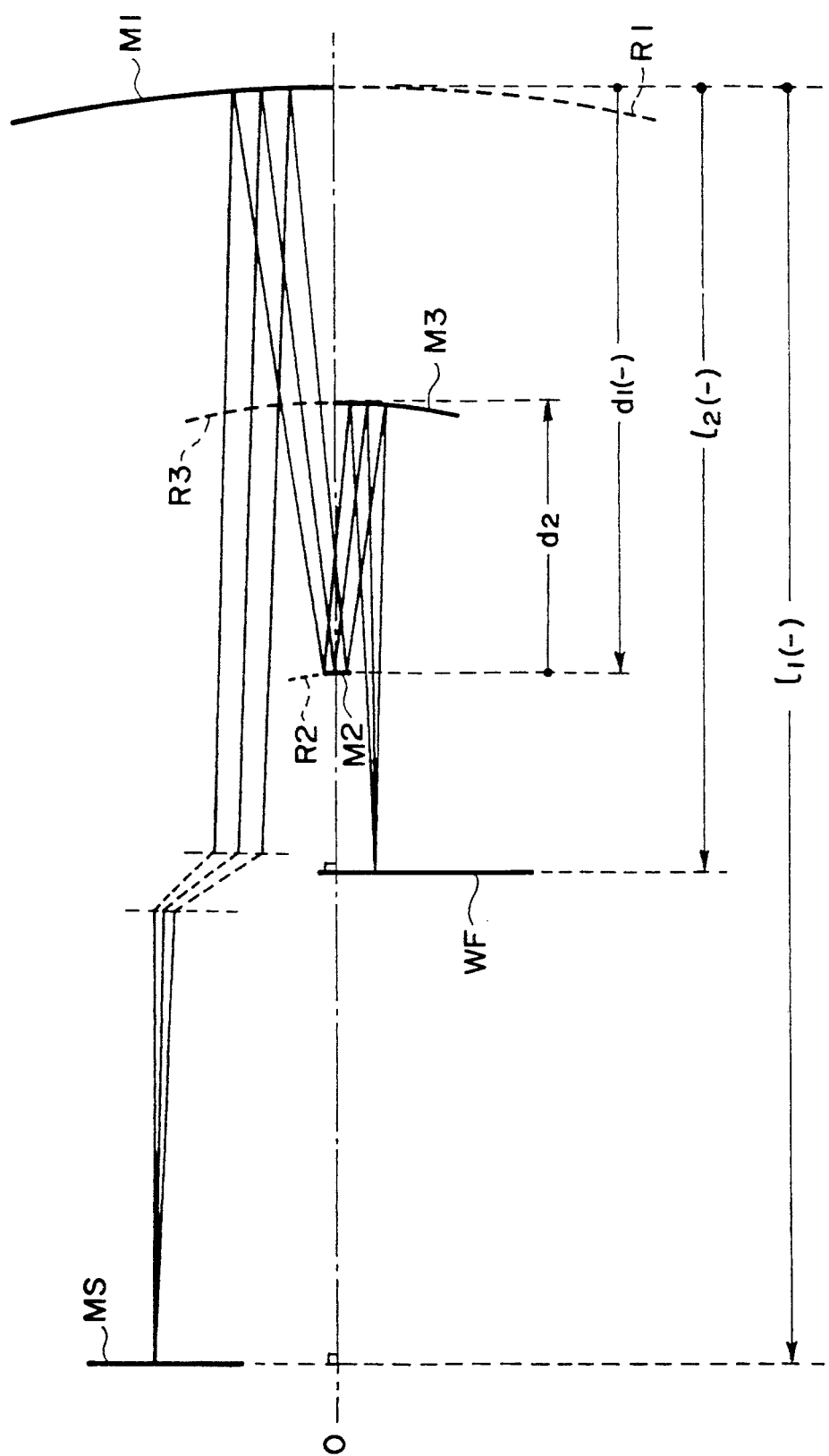
FIG. 1 schematically illustrates an imaging arrangement of an X-ray reduction projection imaging system of a reflection type applicable to an exposure apparatus according to a first embodiment of the present invention.

Referring to FIG. 1, there is shown an X-ray reduction projection imaging system of a reflection type according to a first embodiment of the present invention. In the Figure, an object plane is depicted by reference characters MS where a mask or the like is placed, and an image plane is depicted by reference characters WF where a wafer or the like is placed. The projection imaging system comprises reflection mirrors M1, M2 and M3 including a multi-layer film for reflecting X-rays to form an image in a reduced scale, the multi-layer film being designated by references R1, R2 and R3, respectively. The distances among those elements are indicated as follows:

- $d_1$: a plane distance between the reflecting mirrors M1 and M2;
- $d_2$: a plane distance between the reflecting mirrors M2 and M3;
- $l_1$: a distance between a reflecting mirror M1 and the object, that is, the mask MS;
- $l_2$: a distance between the reflecting mirror M1 and the image plane, that is, the wafer WS.

Those dimensions are the distances measured along an imaging axis O.

Figure 2:
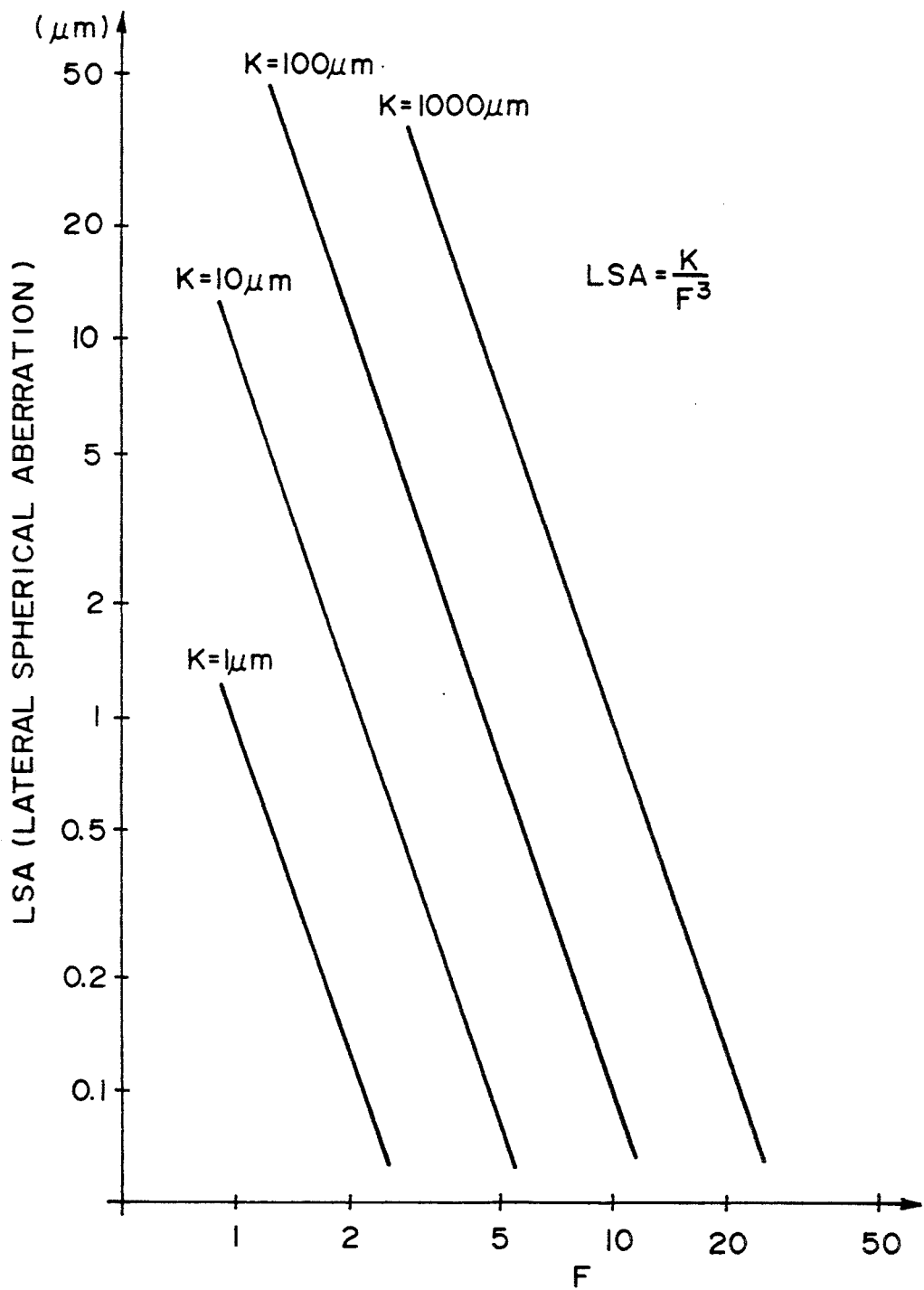
FIGS. 2 and 3 are graphs explaining principles of the imaging system shown in FIG. 1.

Thus, the reduction projection imaging system of a reflection type shown in FIGS. 1 and 2 is structured by the concave reflecting mirror M1, the convex reflecting mirror M2 and the concave reflecting mirror M3, in the order named from the mask MS. The imaging system is effective to project in a reduced scale a circuit pattern of the mask MS onto the wafer WF, more particularly onto a resist applied on the surface of the wafer WF.

Figure 4:
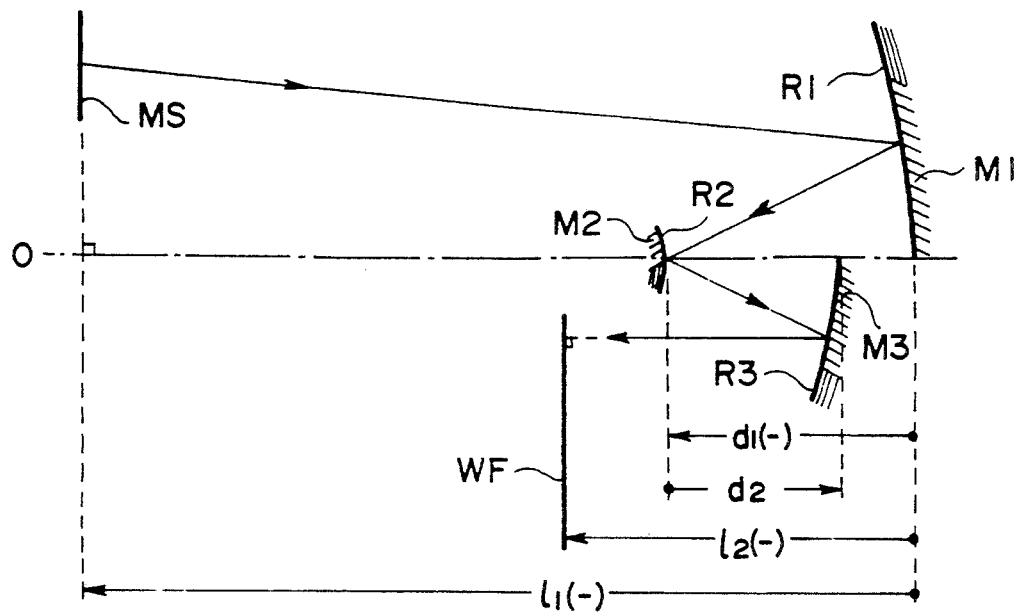
FIG. 4 illustrates an image arrangement of major imaging elements of the FIG. 1 imaging system using multi-layer reflecting mirror.

The major specifications usually required for a projection imaging system performing the surface projection shown in FIG. 1 and FIG. 4 in an exposure apparatus for producing an ultra LSI (64 megabits or 256 megabits) contain ultra high resolution, a large size of image plane and no distortion. It is said that in the case of 64 megabits, the minimum line width of 0.35 micron and the image plane size of $28 \times 10$ mm$^2$ are required, and that in the case of 256 megabits, the minimum line width of 0.25 micron and the image plane size of $40 \times 20$ mm$^2$ are required. These requirements are generally contradictory to each other, and conventional imaging systems do not satisfy those requirements and specifications simultaneously. The projection imaging system of this embodiment makes it possible to satisfy those requirements.

In order to obtain a large image plane size, what is most important is that the flatness or planarity of the image plane is excellent, in other words, the curvature of the image plane is corrected satisfactorily. In consideration of this, in the projection imaging system of FIG. 1, paraxial curvature radius $r_1$, $r_2$ and $r_3$ of the concave mirror M1, the convex mirror M2 and the concave mirror M3 satisfy the following:

$$0.9 < r_2/r_1 + r_2/r_3 < 1.1 \ldots \quad (1)$$

This is the condition for reducing the petzval sum $(1/r_1 - 1/r_2 + 1/r_3)$. If this is not satisfied, it is difficult to obtain a necessary resolution over the entire size of the image plane, so that the above described specifications are not satisfied. The petzval sum $1/r_1 - 1/r_2 + 1/r_3$ reaches 0 with $r_2/r_1 + r_2/r_3$ reaching 1. Therefore, the most ideal is $r_2/r_1 + r_2/r_3 = 1$. In order to satisfy the above described specifications, it is necessary that aberrations other than the curvature of the image plane or the curvature of field, more particularly, the spherical aberration, coma, astigmatism and distortion are satisfactorily corrected. In the projection imaging system of FIG. 1, those aberrations are corrected by reflecting the ray from the object by the concave mirror M1, the convex mirror M2 and the concave mirror M3 in this order, and by giving a function of an aperture stop to the convex mirror M2. In addition, at least one of the concave mirrors M1 and M3 and convex mirror M2 has an aspherical or a non-spherical mirror surface so as to further improve the correction of those aberrations. Particularly, non-spherical surfaces of the concave mirrors M1 and M3 are desirable for improvement of imaging performance. More particularly, in order to correct the above discussed aberrations, i.e., Seidel's five aberrations, the projection imaging system of FIG. 1 has paraxial curvature radii of the concave mirrors M1 and M3 and the convex mirrors M2 which are determined so as to maintain a small petzval sum, while the plane distances among the elements are so determined that the distortion is corrected, and the coma, astigmatism and spherical aberration are corrected by using the non-spherical surfaces.

FIG. 2 is a graph showing a relation between a geometrical aberration of an imaging system and an effective F-number. As representative of the geometrical aberrations, a lateral spherical aberration LSA is taken. The lateral spherical aberration is inversely proportional to a third power of the effective F-number, more particularly:

$$LSA = K/F^3 \ldots \quad (2)$$

F: the effective F-number; and
K: a constant.

In FIG. 2 the relation is expressed in a log-log graph.

The constant K in effect means the value of the lateral spherical aberration when the effective F-number is 1. The value of the constant K changes depending on the number of lenses (mirrors) constituting the imaging system, the type of the imaging system and the design of the imaging system.

In a conventional optical stepper, a number of lenses (not less than 10) are used to accomplish the constant K of approximately 1 micron.

However, in a reflection imaging system for the X-ray as in this system, the number of mirrors used is desirably as small as possible in order to increase the amount of usable rays as the rate absorbed by the mirror is large.

In the case of the imaging system in this embodiment, when the number of mirrors is 3–5, the constant K is about 100 times the conventional, that is, the constant K is of the order of 100 microns.

The imaging system having the constant K of 100 microns, has the property on the line indicated by "K=100 microns" in the FIG. 2 graph. Therefore, it is understood, in order to reduce the lateral spherical aberration down to not more than 0.35 microns in the imaging system, it is required that the effective F-number is not less than 6.6 from the equation (2).

However, with the increase of the F-number, the amount of blurrness due to diffraction increases. The radius of the blurrness due to the diffraction is represented as an Airy's disk radius $r_0$, as follows:

$$r = 1.22 F \lambda \ldots \quad (3)$$

F: the effective F-number; and
λ: the wavelength.

Figure 3:
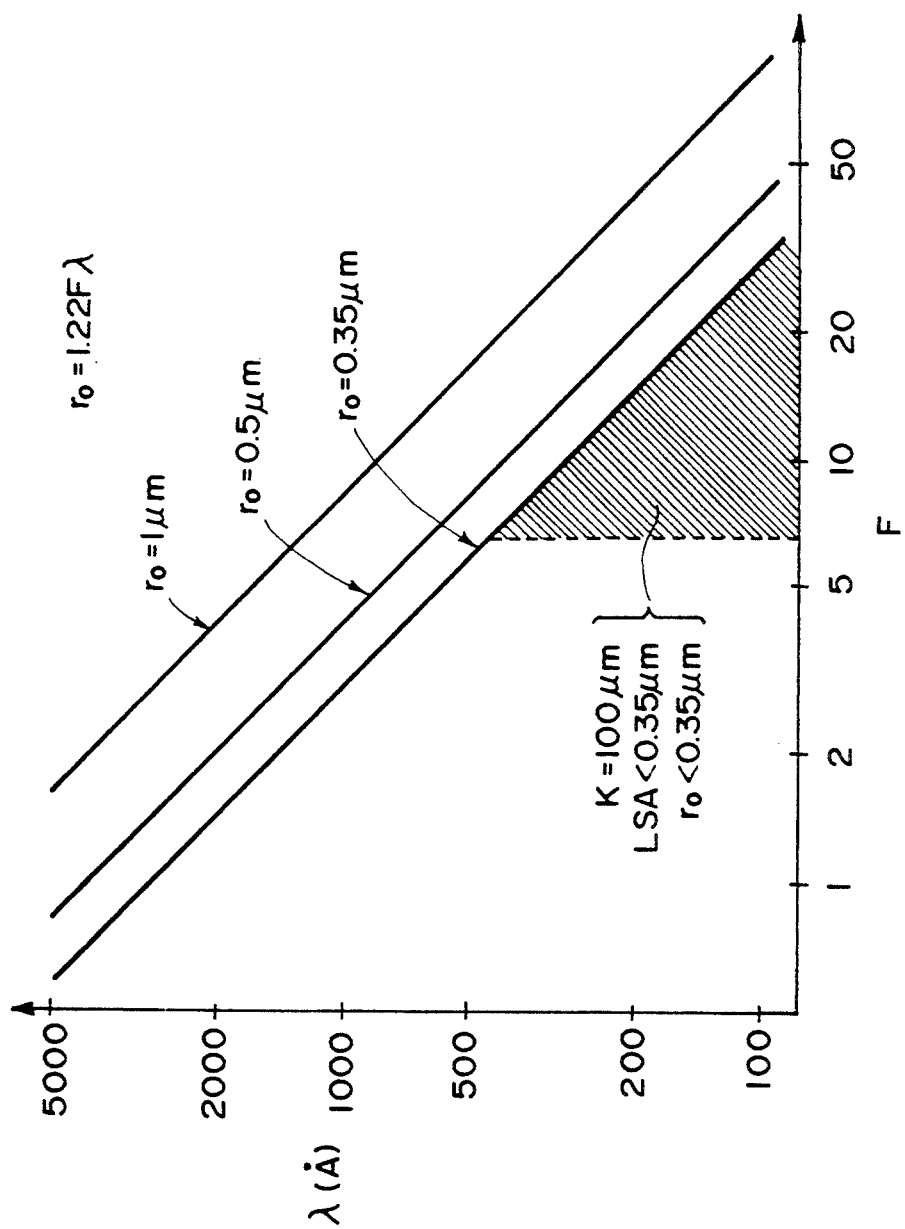

FIG. 3 is a graph representing the relation of the equation (3) in a log-log scale for three values of radii $r_0$. According to this graph, when it is required that $r_0 < 0.35$ micron, the combination of the effective F-number F and the wavelength λ is selected within the region below the bottommost line.

Therefore, in order to obtain a required resolution, the imaging system is such that the geometric aberration shown in FIG. 2 and the blurrness due to the diffraction shown in FIG. 3 are both below the tolerances.

For example, in the imaging system having the constant K of 100 microns, in order to satisfy the performance of LSA<0.35 micron and $r_0 < 0.35$ micron, the graph of FIG. 2 gives F>6.6, and therefore, the graph of FIG. 3 gives the combination of the effective F-number and the wavelength within the hatched region. However, in this exemplary imaging system, if the light in the visible region is used, the influence by the diffraction is too large, so that the resolution on the order of submicrons cannot be obtained. Therefore, the resolution on the order of submicrons is achieved by using the radiation within the short wavelength soft X-ray. Thus, although the imaging system of this embodiment uses a small number of mirrors, it is possible to reduce the geometrical aberrations and the blurrness due to diffraction down to not more than submicrons in the soft X-ray wavelength region.

FIG. 4 shows an arrangement, stressing the major parts of the imaging system of FIG. 1, wherein the reflecting mirrors have multi-layer reflecting films.

The reduction projection imaging system of a refraction type shown in FIGS. 1 and 4 are essentially a coaxial imaging system, and only one half mirror surface of each of concave mirrors M1 and M3 are used. It is possible that at least one of the concave mirrors M1 and M3 and the convex mirror M2 is deviated from the coaxial relationship so as to slightly incline with respect to the system axis O, thereby further improving the correction of the aberrations.

Figure 5:
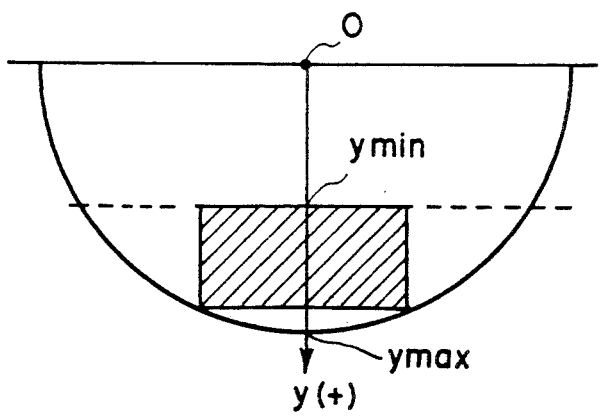
FIG. 5 illustrates an imaging surface of the imaging system shown in FIG. 4.

Referring to FIG. 5, the image plane of the imaging system of FIG. 4 is explained wherein the reference y represents an image height; $y_{max}$, a maximum image region $y_{min} \leq y \leq y_{max}$ is used as the image plane or region $y_{min} \leq y \leq y_{max}$ is used as the image plane or surface. The rays reaching to this region are substantially free from eclipse, and therefore, a uniform distribution of radiation amount can be provided with the vignetting factor of 100%. In FIG. 5, the exemplary usable image plane has the maximum rectangular region under the condition that the ratio of the long side and the short side is 2:1. Of course, the various aberrations discussed above are satisfactorily corrected. When the image plane having such a rectangular configuration is used, the short side of the rectangular configuration is given by $y_{max} - y_{min}$, and the long side is given by $$\sqrt{2y_{max}^2 - y_{min}^2} - y_{min} \, .$$

The concave mirrors M1 and M3 and the convex mirror M2 of the FIG. 4 projection imaging system, have the respective reflecting surfaces coated with reflecting films for efficiently reflecting X-rays. Each of the reflecting films is constituted by several tens of layers. The reflectivity is very much improved as compared with the reflecting mirror without the reflecting film. The multi-layer reflecting film may be constituted by a combination of such different materials that the difference in the refractive indexes of the adjacent layers is large, for example, a multi-layer film containing a semiconductor element and a transition metal element having a high fusing point, a multi-layer film containing a low fusing point metal element and a semiconductor element or a light metal element, or a multi-layer film containing white metal element and a semiconductor element. More particularly, examples of combinations are tungsten W and carbon C; tantalum Ta and silicon Si; gold Au and carbon C; rhenium Re and carbon C; lead Pb and silicon Si; ruthenium Ru and silicon Si; paradium Pd and silicon Si; thodium Rh and silicon Si; ruthenium Ru and beryllium Be; ruthenium Ru and boron B; rhodium Rh and boron B; palladium Pd and boron B.

Examples of the multi-layer reflecting film will be described. In the following, the different materials constituting the multi-layer film are called "first material" and "second material".

---

For X-rays of 114.0 angstrom wavelength

EXAMPLE 1-1
First Material: Ru
Second Material: Si
Film Thickness of the 1st Mat.: 36.4 angstroms
Film Thickness of the 2nd Mat.: 23.5 angstroms
Number of Layers: 41
Reflectivity
(Angle of incidence: 0 degree (perpendicular)):
38.6%, without a protection film;
37.9%, with a protection film of C having the thickness of 5 angstroms on the top layer.
First Material: Ru
Second Material: Si
Film Thickness of the 1st Mat.: 39.1 angstroms
Film Thickness of the 2nd Mat.: 25.2 angstroms
Number of Layers: 41
Reflectivity (Angle of incidence: 20 degrees):
40.1%, without a protection film;
39.4%, with a protection film of C having the thickness of 5 angstroms on the top layer.
EXAMPLE 1-2
First Material: Pd
Second Material: Si
Film Thickness of the 1st Mat.: 31.3 angstroms
Film Thickness of the 2nd Mat.: 28.0 angstroms
Number of Layers: 41
Reflectivity (Angle of incidence: 0 degree): 26.1%
First Material: Pd
Second Material: Si
Film Thickness of the 1st Mat.: 33.3 angstroms
Film Thickness of the 2nd Mat.: 30.1 angstroms
Number of Layers: 41
Reflectivity (Angle of incidence: 20 degrees): 26.7%

---

For X-rays of 112.7 angstroms wavelength

EXAMPLE 1-3
First Material: Ru
Second Material: Be
Film Thickness of the 1st Mat.: 26.6 angstroms
Film Thickness of the 2nd Mat.: 30.6 angstroms
Number of Layers: 41
Reflectivity (Angle of incidence: 0 degree): 77.2%
First Material: Ru
Second Material: Be
Film Thickness of the 1st Mat.: 27.4 angstroms
Film Thickness of the 2nd Mat.: 33.4 angstroms -continued Number of Layers: 41
Reflectivity (Angle of incidence: 20 degrees): 79.9%

For X-rays of 108.7 angstroms wavelength

EXAMPLE 1-4
First Material: Rh
Second Material: Si
Film Thickness of the 1st Mat.: 33.4 angstroms
Film Thickness of the 2nd Mat.: 23.4 angstroms
Number of Layers: 41
Reflectivity (Angle of incidence: 0 degree): 33.2%
First Material: Rh
Second Material: Si
Film Thickness of the 1st Mat.: 48.2 angstroms
Film Thickness of the 2nd Mat.: 28.8 angstroms
Number of Layers: 41
Reflectivity (Angle of incidence: 40 degrees): 38.7%

For X-rays of 82.1 angstroms wavelength

EXAMPLE 1-5
First Material: Ru
Second Material: B
Film Thickness of the 1st Mat.: 20.1 angstroms
Film Thickness of the 2nd Mat.: 21.8 angstroms
Number of Layers: 41
Reflectivity (Angle of incidence: 0 degree): 18.0%
First Material: Ru
Second Material: B
Film Thickness of the 1st Mat.: 21.3 angstroms
Film Thickness of the 2nd Mat.: 23.4 angstroms
Number of Layers: 41
Reflectivity (Angle of incidence: 20 degrees): 21.6%

EXAMPLE 1-6
First Material: Rh
Second Material: B
Film Thickness of the 1st Mat.: 20.0 angstroms
Film Thickness of the 2nd Mat.: 21.9 angstroms
Number of Layers: 41
Reflectivity (Angle of incidence: 0 degree): 15.7%
First Material: Rh
Second Material: B
Film Thickness of the 1st Mat.: 21.0 angstroms
Film Thickness of the 2nd Mat.: 23.6 angstroms
Number of Layers: 41
Reflectivity (Angle of incidence: 20 degrees): 18.8%

EXAMPLE 1-7
First Material: Rh
Second Material: B
Film Thickness of the 1st Mat.: 19.4 angstroms
Film Thickness of the 2nd Mat.: 22.4 angstroms
Number of Layers: 41
Reflectivity (Angle of incidence: 0 degree): 13.2%
First Material: Rd
Second Material: B
Film Thickness of the 1st Mat.: 20.6 angstroms
Film Thickness of the 2nd Mat.: 24.0 angstroms
Number of Layers: 41
Reflectivity (Angle of incidence: 20 degrees): 15.7%

The multi-layer reflecting films described above are for the X-rays having wavelengths ranging from 80-120 angstroms. However, multi-layer reflecting films for the X-rays outside this range can be obtained by one having ordinary skill in the art in consideration of the above by properly selecting a combination of the above described materials. Each of the first and second materials is formed by a single element in the above examples, but may be synthesized of plural elements.

Examples of dimensions of the projection imaging system shown in FIGS. 1 and 4 will be described. In the imaging system, it is preferable that at least one of the concave mirrors M1 and M3 and the convex mirror M2 has a non-spherical reflecting surface, and therefore, in the examples which will be described has at least one non-spherical reflecting mirror.

In the following, "Ki" (i=1, 2, 3) is a non-sphericality of the i(th) surface as counted from the object side, which can be represented by the following equation:

$$X = (H^2/ri)/[1 + \sqrt{1 - (1 + Ki)(H/ri)^2}\,]$$

X: coordinate in the system axis direction;
H: a distance in the perpendicular direction away from the system axis;
ri (i=1, 2, 3): paraxial curvature radius of the i(th) surface as counted from the object side;
$l_1$: distance between the concave mirror M1 and the mask MS;
$l_2$: distance from the reflecting mirror M1 and the wafer WF;
$d_1$: plane distance between the concave mirror M1 and the convex mirror M2; and
$d_2$: a plane distance between the convex mirror M2 and the concave mirror M3.

EXAMPLE 1-8
Magnification: 1/5, Effective F-number: 30
Image field size: 28 × 14 mm, Resolution: 0.35 microns
Image height: 5-24 mm
   $l_1$ = −1288.7 mm
   $l_2$ = −298.9 mm
   $r_1$ = −635.99 mm
                $d_1$ = −165.00 mm
   $r_2$ = −213.51 mm
                $d_2$ = 165.00 mm
   $r_3$ = −321.40 mm
   $K_1$ = −2.26097
   $K_2$ = −0.12295
   $K_3$ = 0.11246
Performance:
MTF (Spatial Frequency = 1500 lp/mm)
Wavelength = 0 . . . 85%
Wavelength = 13.3 angstroms . . . 80%
Distortion = −0.3%

EXAMPLE 1-9
Magnification: 1/5, Effective F-number: 30
Image field size: 40 × 20 mm, Resolution: 0.25 microns
Image height: 10-40 mm
   $l_1$ = −2577.4 mm
   $l_2$ = −597.9 mm
   $r_1$ = −1271.98 mm
                $d_1$ = −330.00 mm
   $r_2$ = −427.01 mm
                $d_2$ = 330.00 mm
   $r_3$ = −642.81 mm
   $K_1$ = −2.26097
   $K_2$ = −0.12295
   $K_3$ = 0.11246
Performance:
MTF (Spatial Frequency = 2000 lp/mm)
Wavelength = 0 . . . 75%
Wavelength = 13.3 angstroms . . . 75%
Distortion = −0.24%

EXAMPLE 1-10
Magnification: 1/5, Effective F-number: 15
Image field size: 28 × 14 mm, Resolution: 0.35 microns
Image height: 20-37 mm
   $l_1$ = −2577.4 mm
   $l_2$ = −597.9 mm
   $r_1$ = −1271.98 mm
                $d_1$ = −330.00 mm
   $r_2$ = −427.01 mm
                $d_2$ = 330.00 mm
   $r_3$ = −642.81 mm
   $K_1$ = −2.26097
   $K_2$ = −0.12295
   $K_3$ = 0.11246
Performance:
MTF (Spatial Frequency = 1500 lp/mm)
Wavelength = 0 . . . 70%
Wavelength = 13.3 angstroms . . . 70%

Wavelength = 100 angstroms ... 60%
Wavelength = 200 angstroms ... 40%
Distortion = −0.2%

EXAMPLE 1-11

Magnification: 1/5, Effective F-number: 13
Image field size: 28 × 14 mm, Resolution: 0.35 microns
Image height: 20–37 mm
  $l_1 = -3000.0$ mm
  $l_2 = -602.5$ mm
  $r_1 = -1181.91$ mm
    $d_1 = -449.68$ mm
  $r_2 = -325.97$ mm
    $d_2 = 210.01$ mm
  $r_3 = -448.92$ mm
  $K_1 = -0.94278$
  $K_2 = -0.07146$
  $K_3 = 0.14283$ Performance:
MTF (Spatial Frequency = 1500 lp/mm)
Wavelength = 0 ... 80%
Wavelength = 13.3 angstroms ... 80%
Wavelength = 100 angstroms ... 65%
Wavelength = 200 angstroms ... 45%
Distortion = not more than −0.00005%

EXAMPLE 1-12

Magnification: 1/5, Effective F-number: 13
Image field size: 40 × 20 mm, Resolution: 0.25 microns
Image height: 27–52 mm
  $l_1 = -4500.0$ mm
  $l_2 = -903.6$ mm
  $r_1 = -1772.60$ mm
    $d_1 = -674.44$ mm
  $r_2 = -488.89$ mm
    $d_2 = 315.17$ mm
  $r_3 = -673.46$ mm
  $K_1 = -0.94301$
  $K_2 = -0.08049$
  $K_3 = 0.14261$ Performance:
MTF (Spatial Frequency = 2000 lp/mm)
Wavelength = 0 ... 50%
Wavelength = 13.3 angstroms ... 50%
Wavelength = 100 angstroms ... 40%
Wavelength = 200 angstroms ... 35%
Distortion = not more than −0.000004%

EXAMPLE 1-13

Magnification: 1/5, Effective F-number: 13
Image field size: 28 × 14 mm, Resolution: 0.35 microns
Image height: 20–37 mm
  $l_1 = -3000.0$ mm
  $l_2 = -602.7$ mm
  $r_1 = -1182.14$ mm
    $d_1 = -449.96$ mm
  $r_2 = -325.53$ mm
    $d_2 = 210.66$ mm
  $r_3 = -449.22$ mm
  $K_1 = -0.93900$
  $K_2 = 0$ (spherical)
  $K_3 = 0.14403$ Performance:
MTF (Spatial Frequency = 1500 lp/mm)
Wavelength = 0 ... 60%
Wavelength = 13.3 angstroms ... 60%
Wavelength = 100 angstroms ... 55%
Wavelength = 200 angstroms ... 45%
Distortion = not more than 0.01 micron

EXAMPLE 1-14

Magnification: 1/2, Effective F-number: 26
Image field size: 34 × 17 mm, Resolution: 0.35 microns
Image height: 40–60 mm
  $l_1 = -1431.1$ mm
  $l_2 = -719.0$ mm
  $r_1 = -847.10$ mm
    $d_1 = -263.73$ mm
  $r_2 = -309.30$ mm
    $d_2 = 130.56$ mm
  $r_3 = -486.35$ mm
  $K_1 = -1.72866$
  $K_2 = -1.60435$
  $K_3 = -0.78100$ Performance:
MTF (Spatial Frequency = 1500 lp/mm)
Wavelength = 0 ... 80%
Wavelength = 13.3 angstroms ... 75%
Wavelength = 100 angstroms ... 45%
Wavelength = 200 angstroms ... 14%
Distortion = 0.1 micron

EXAMPLE 1-15

Magnification: 1, Effective F-number: 39
Image field size: 36 × 18 mm, Resolution: 0.35 microns
Image height: 70–90 mm
  $l_1 = -934.6$ mm
  $l_2 = -1054.2$ mm
  $r_1 = -834.76$ mm
    $d_1 = -266.67$ mm
  $r_2 = -306.69$ mm
    $d_2 = 107.85$ mm
  $r_3 = -483.92$ mm
  $K_1 = -1.82882$
  $K_2 = -1.83789$
  $K_3 = -1.19285$ Performance:
MTF (Spatial Frequency = 1500 lp/mm)
Wavelength = 0 ... 70%
Wavelength = 13.3 angstroms ... 65%
Wavelength = 100 angstroms ... 30%
Wavelength = 200 angstroms ... 0%
Distortion = 0.1 micron In Examples 1-8 to 1-10, the concave mirrors M1 and M3 are substantially equidistant from the convex mirror M2. Examples 1-8 and 1-10 are suitable for manufacturing LSI of the order of 64 megabits. Example 1-9 is suitable for manufacturing LSI of the order of 256 megabits. The projection systems of embodiments 1-8 to 1-10 are relatively compact and of high resolution, but there is a chance that a slight distortion remains. If it remains, the distortion may be compensated by giving to the mask pattern itself, distortion opposite to the distortion not corrected by the projection imaging system.

Examples 1-11 to 1-15 relate to the cases where the concave mirror M3 is disposed, with respect to travel of X-rays, between the concave mirror M1 and the convex mirror M2, wherein the concave mirror M3 is disposed spaced apart by approximately one half of the distance between the concave mirror M1 and the convex mirror M2. Examples 1-11 and 1-12 are for manufacturing LSI on the order of 64 megabits and 256 megabits, in which almost all distortions are substantially completely removed, and the effective F-number is 13 which means a light imaging system. In Example 1-13, the convex mirror M2 has a spherical surface and is designed for 64 megabit LSI. Example 1-14 has a projection magnification of ½ and is designed for 64 megabits LSI manufacturing. Example 1-15 has a unit projection magnification and is designed for 64 megabit LSI manufacturing. Examples 1-8 to 1-13 have the projection magnification of 1/5. All the embodiments except for Example 1-13 has three mirrors M1, M2 and M3 all of which have non-spherical deflecting mirror surface.

The projection imaging system described above employs three reflecting mirrors M1, M2 and M3. However, the projection system applicable to the projection exposure apparatus according to the present invention is not limited to the above-described detailed examples. For example, an additional mirror, that is, a fourth mirror M4 may be added. In order to efficiently reflect the X-rays, the multi-layer reflecting film is used as discussed above. However, even if the multi-layer reflecting film is used, the increase in the number of reflecting mirrors necessarily leads to loss of the X-ray. For this reason, the number of the reflecting mirrors constituting the projection imaging or radiation system is preferably small.

In the foregoing, the projection imaging system has been described as being used for a plane projection, but the present invention is applicable to the case where a region of a predetermined image height range providing small aberration is projected through an arcuate slit or the like, and the mask and wafer are simultaneously scanningly moved so as to sequentially transfer the pattern.

Figure 6:
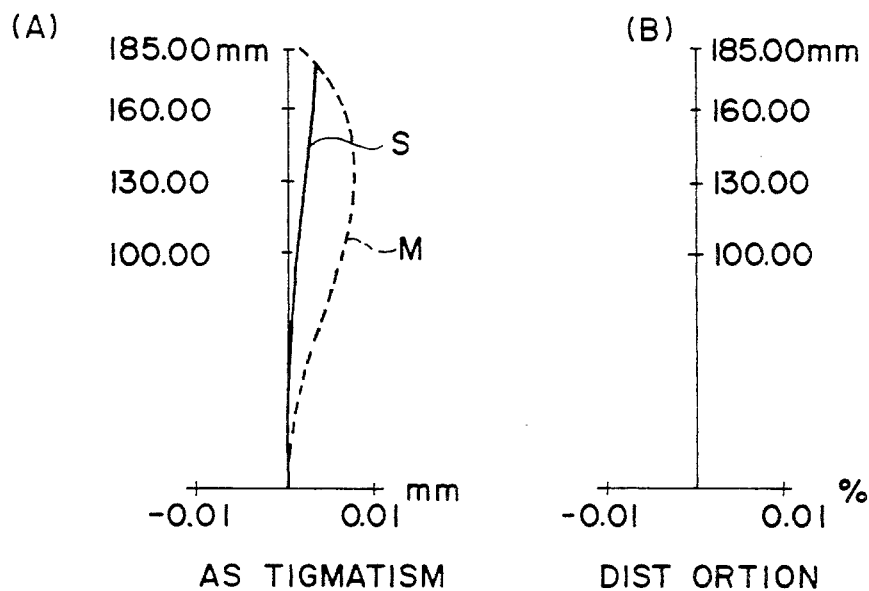
FIG. 6 shows examples of astigmatism and distortion of the imaging system shown in FIG. 1.
Figure 7:
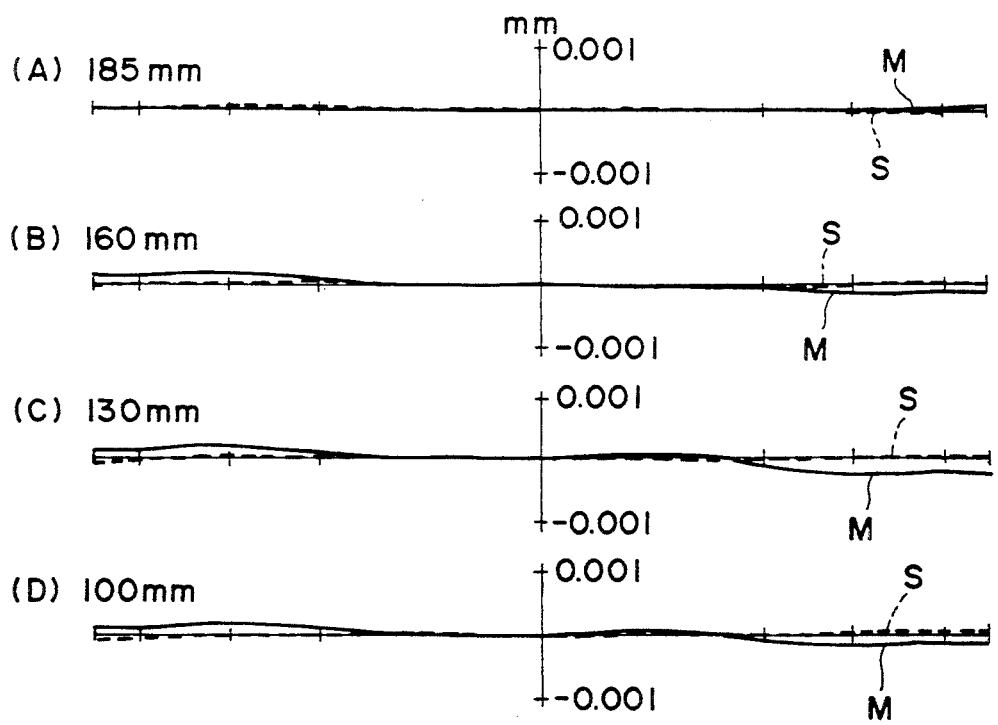
FIG. 7 shows an example of lateral aberrations at different image heights in the imaging system shown in FIG. 1.

FIGS. 6 and 7 show aberrations in the FIG. 1 projection imaging system and a fourth embodiment. In FIG. 6, a graph (A) represent an astigmatism, and graph (B) represent a distortion. In FIG. 7, graphs (A)-(D) represent lateral aberrations at different image height, (A) being for the image height of 185 mm; (B), 160 mm; (C), 130 mm; (D), 100 mm. In FIG. 6, the ordinate represents the image height. References M and S designate meridional surface and saggital surface, respectively.

As will be understood from FIGS. 6 and 7, the aberration correction is satisfactory for the use of the projection imaging system of this kind. Particularly, the distortion in FIG. 6(B) is approximately 0, and therefore, the distortion is not shown in the Figure. Additionally, the aberration correction can be made satisfactorily in such a wide range as to meet the imaging system applicable to the plane projection exposure system, which necessitates a wide exposure area. Furthermore, the imaging system has a satisfactory MTF property sufficient to provide resolution on the order of submicrons.

Figure 8:
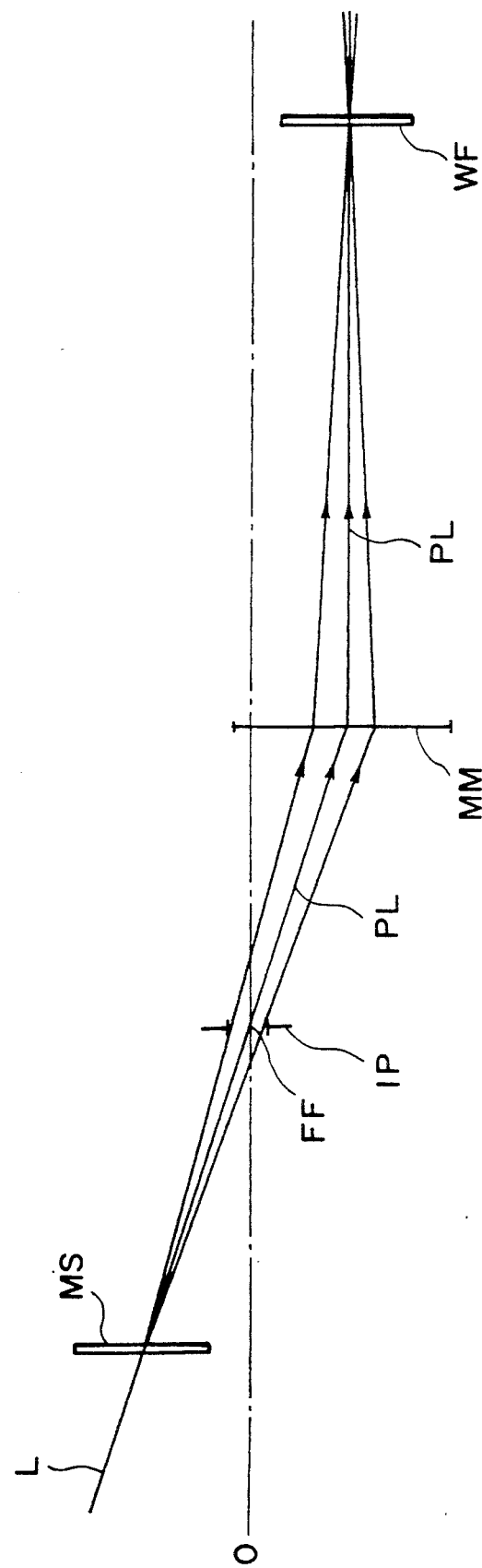
FIG. 8 illustrates the reason why the illumination beam is incident non-perpendicularly with respect to the mask as shown in FIG. 1 and FIG. 4.

FIG. 8 explains the principle of the non-perpendicular incidence of illumination rays to the mask MS in FIGS. 1 and 4. In a exposure system or the like, it is preferable that when the rays are applied to the wafer for printing the mask pattern thereon, the rays are incident perpendicularly to the wafer, that is, the illumination system is telecentric. In FIG. 8, the reflecting mirrors M1, M2 and M3 are generally indicated by reference MM; IP indicates a position of its entrance pupil; FF, a front focus point; PL, a principal ray passing through the center of the mask MS and the front focal point FF. In order for the pattern of the mask MS to be incident perpendicularly or substantially perpendicularly, the ray from the center of the mask MS passes through the front focal point FF, and the marginal rays therearound pass through the entrance pupil. In consideration of these, the rays L are inclinedly incident onto the mask MS. Then, most of the rays are incident perpendicularly and/or substantially perpendicularly onto the wafer WF. This is preferable in the reflection system when only one half of the system arrangement above or below the system axis is used.

EMBODIMENT 2

Figure 9:
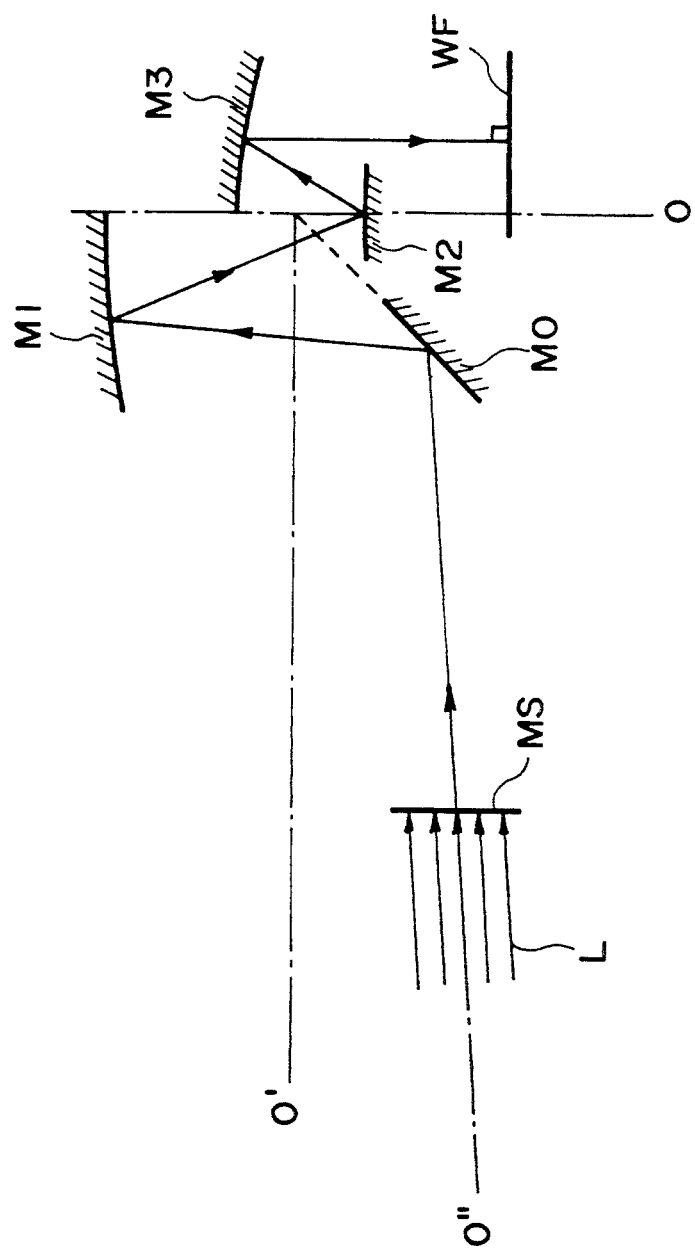
FIG. 9 shows an arrangement of a reflection imaging system according to a second embodiment of the present invention which is suitable to a system wherein the wafer is stepwisely moved while being exposed to a pattern.

FIG. 9 shows an imaging arrangement of an X-ray reduction projection imaging system of a reflection type which is small in size, according to a second embodiment of the present invention.

When the imaging system shown in FIGS. 1 and 4 is used, the rays from the mask MS toward the reflection mirror M1 are liable to be blocked at the time when an unshown wafer stage is moved in order to stepwisely expose each of the shot area of the wafer WF. The system arrangement of FIG. 9 is intended to eliminate this liability. The system of this embodiment is provided with a fourth reflecting mirror M0. As will be understood from the Figure, the movable range of the wafer WF is uninfluential to the imaging system. In order for the wafer WF to be illuminated by rays perpendicularly or substantially perpendicularly incident onto the wafer WF, the reflecting mirror M0 may be inclined at an angle other than 45 degrees, although FIG. 9 shows the example of 45 degrees.

Examples of multi-layer films preferably usable for the reflecting mirror M0 will be described.

| For X-rays of 114.0 angstroms wavelength |
|---|
| EXAMPLE 2-1 |
| First Material: Ru |
| Second Material: Si |
| Film Thickness of the 1st Mat.: 55.4 angstroms |
| Film Thickness of the 2nd Mat.: 34.3 angstroms |
| Number of Layers: 41 |
| Reflectivity (Angle of incidence: 45 degrees): 43.8% |
| EXAMPLE 2-2 |
| First Material: Pd |
| Second Material: Si |
| Film Thickness of the 1st Mat.: 44.5 angstroms |
| Film Thickness of the 2nd Mat.: 42.3 angstroms |
| Number of Layers: 41 |
| Reflectivity (Angle of incidence: 45 degrees): 29.1% |
| For X-ray of 112.7 angstroms wavelength |
| EXAMPLE 2-3 |
| First Material: Ru |
| Second Material: Be |
| Film Thickness of the 1st Mat.: 30.2 angstroms |
| Film Thickness of the 2nd Mat.: 49.7 angstroms |
| Number of Layers: 41 |
| Reflectivity (Angle of incidence: 45 degrees): 85.3% |
| For X-ray of 108.7 angstroms wavelength |
| EXAMPLE 2-4 |
| First Material: Ru |
| Second Material: Si |
| Film Thickness of the 1st Mat.: 52.7 angstroms |
| Film Thickness of the 2nd Mat.: 31.9 angstroms |
| Number of Layers: 41 |
| Reflectivity (Angle of incidence: 45 degrees): 39.5% |
| For X-ray of 82.1 angstroms wavelength |
| EXAMPLE 2-5 |
| First Material: Ru |
| Second Material: B |
| Film Thickness of the 1st Mat.: 27.6 angstroms |
| Film Thickness of the 2nd Mat.: 32.8 angstroms |
| Number of Layers: 41 |
| Reflectivity (Angle of incidence: 45 degrees): 41.8% |
| EXAMPLE 2-6 |
| First Material: Ru |
| Second Material: B |
| Film Thickness of the 1st Mat.: 26.7 angstroms |
| Film Thickness of the 2nd Mat.: 33.5 angstroms |
| Number of Layers: 41 |
| Reflectivity (Angle of incidence: 45 degrees): 36.6% |
| EXAMPLE 2-7 |
| First Material: Pd |
| Second Material: B |
| Film Thickness of the 1st Mat.: 25.9 angstroms |
| Film Thickness of the 2nd Mat.: 34.2 angstroms |
| Number of Layers: 41 |
| Reflectivity (Angle of incidence: 45 degrees): 30.2% |

EMBODIMENT 3

Figure 10:
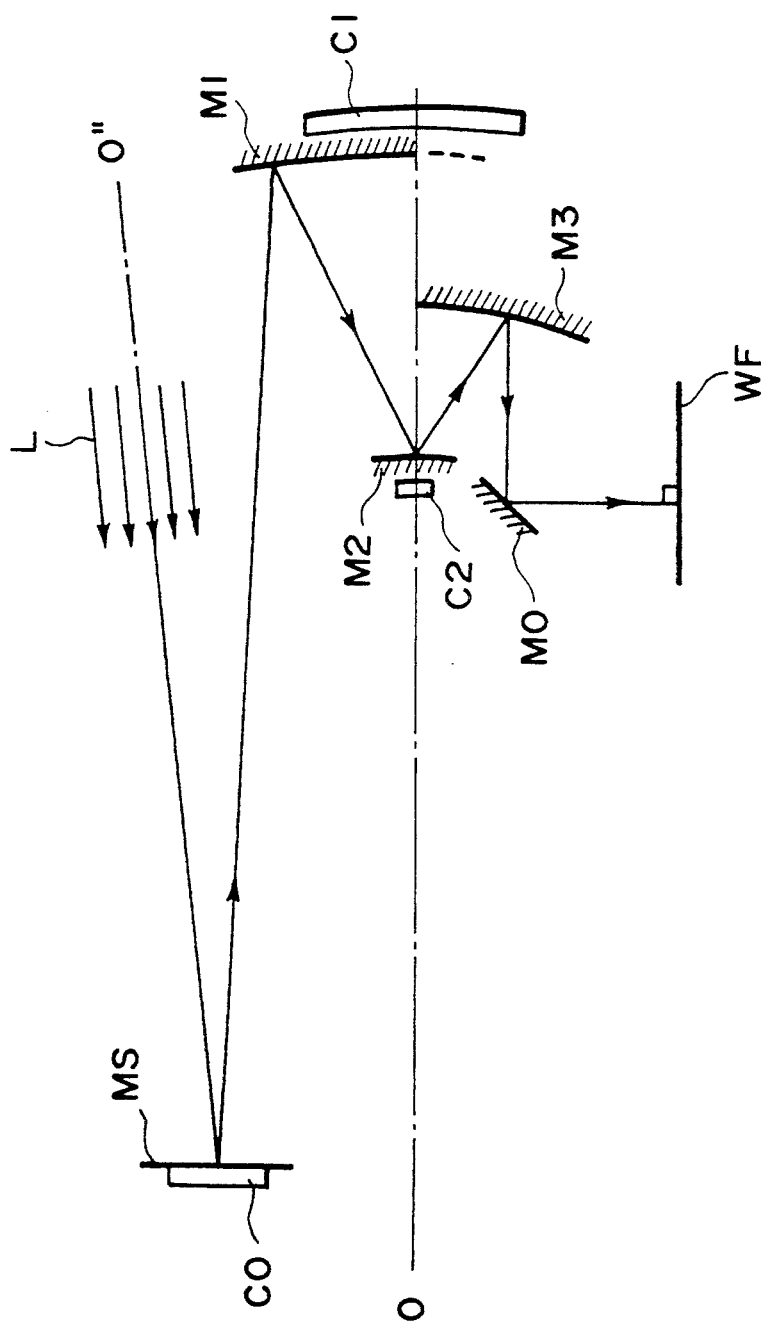
FIG. 10 shows an optical arrangement of an imaging system according to a third embodiment of the present invention wherein a transparent type mask in the FIG. 9 imaging system is replaced by a reflection type mask.

FIG. 10 illustrates a system arrangement of an X-ray reduction projection imaging system of a reflection type which is small in size according to a third embodiment of the present invention.

In the imaging system shown in FIG. 7, the mask MS transmits the exposure rays, whereas the imaging system of FIG. 10 uses a reflection type mask.

This embodiment is preferable in that it matches in principle the FIG. 6 embodiment. This is because when a reflection type mask MS is used, the image rays of the circuit pattern of the mask on which the illumination rays are non-perpendicularly incident, can be efficiently introduced to the reflection mirror M1.

The reflection type mask is preferable also in that a forced cooling means CO may be actable on the back side thereof, examples of the cooling means being a water cooling mechanism or electrostatic cooling mechanism using a Peltier element or the like.

Further, it is preferable that forced cooling means C1 and C2 or the like are provided for the reflection mirrors M1 and M2 or the like, since then the thermal expansion can be avoided. In this case, the cooling means can be provided for at least a few first reflection mirrors, and it is not necessary to provide it for the subsequent reflecting mirrors, because the liability of high temperature is present in the first few mirrors. Of course, the cooling means can be provided for all of the reflecting mirrors. The non-perpendicular incidence of the rays onto the reflection type mask also applies advantageously to the imaging system shown in FIGS. 11, 12 and 13.

EMBODIMENT 4

Figure 11:
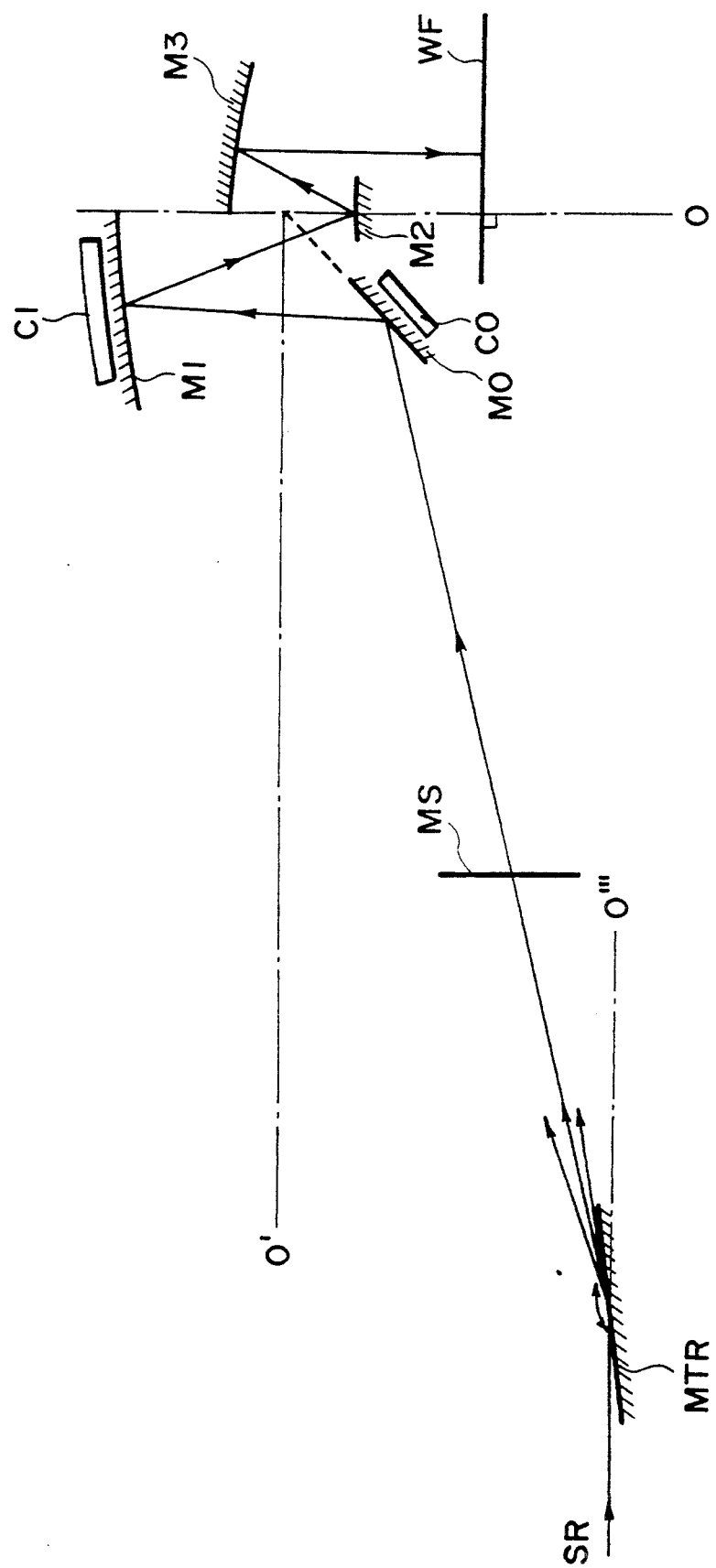
FIG. 11 shows an arrangement of an imaging system according to a fourth embodiment of the present invention wherein horizontally arriving X-rays from an SOR (synchrotron orbital radiation) source are totally reflected by a reflecting mirror and are scanningly reflected.

FIG. 11 shows an arrangement of an X-ray reduction projection imaging system of a reflection type which is small in size according to a fourth embodiment of the present invention. In this system, X-rays SR from a synchrotron orbital radiation source which will hereinafter be called "SOR" are reflected by reflection mirror MRT, and they are non-perpendicularly incident on the mask MS. The reflection mirror MTR is swung with respect to the mask MS, to scan the circuit pattern surface of the mask MS thus insuring a wide exposure area. The reflecting mirror MTR may be of a glancing type or of a multi-layer type. In this embodiment, too, it is preferable to provide the reflecting mirrors M0 and M1 with forced cooling means. An X-ray conduit extending from the SOR source is usually very long, extending in a tangential direction of a ring. Therefore, in the apparatus wherein the distance from the mask MS to the reflecting mirror M1 is long as in this embodiment, the conduit can be commonly used, thus preventing the apparatus from becoming bulky.

EMBODIMENT 5

Figure 12:
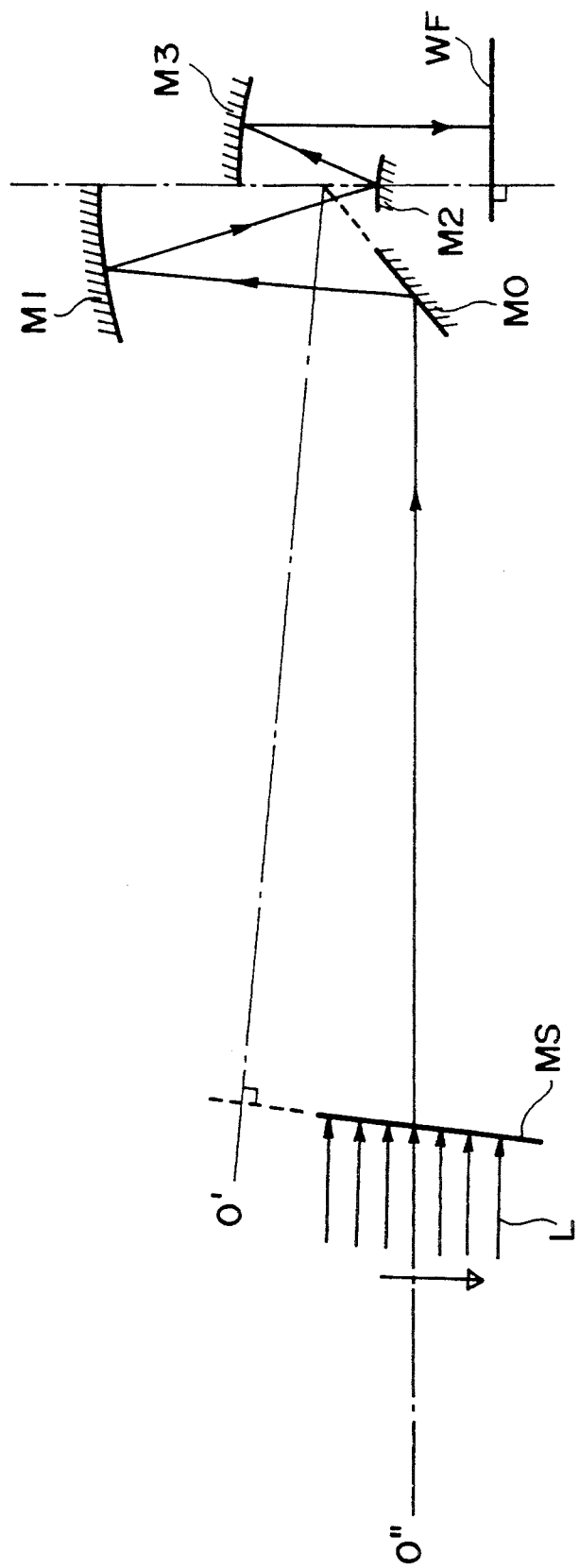
FIG. 12 shows an arrangement of an imaging system according to a fifth embodiment of the present invention wherein a mask is slightly inclined from a vertical position.

FIG. 12 shows an arrangement of an X-ray reduction projection imaging system of a reflection type which is small in size, according to a fifth embodiment of the present invention. In this system, the X-ray is scanningly deflected substantially vertically within the SOR source. The mask MS is set inclined from the vertical direction at a predetermined angle to provide non-perpendicular incidence of rays.

EMBODIMENT 6

Figure 13:
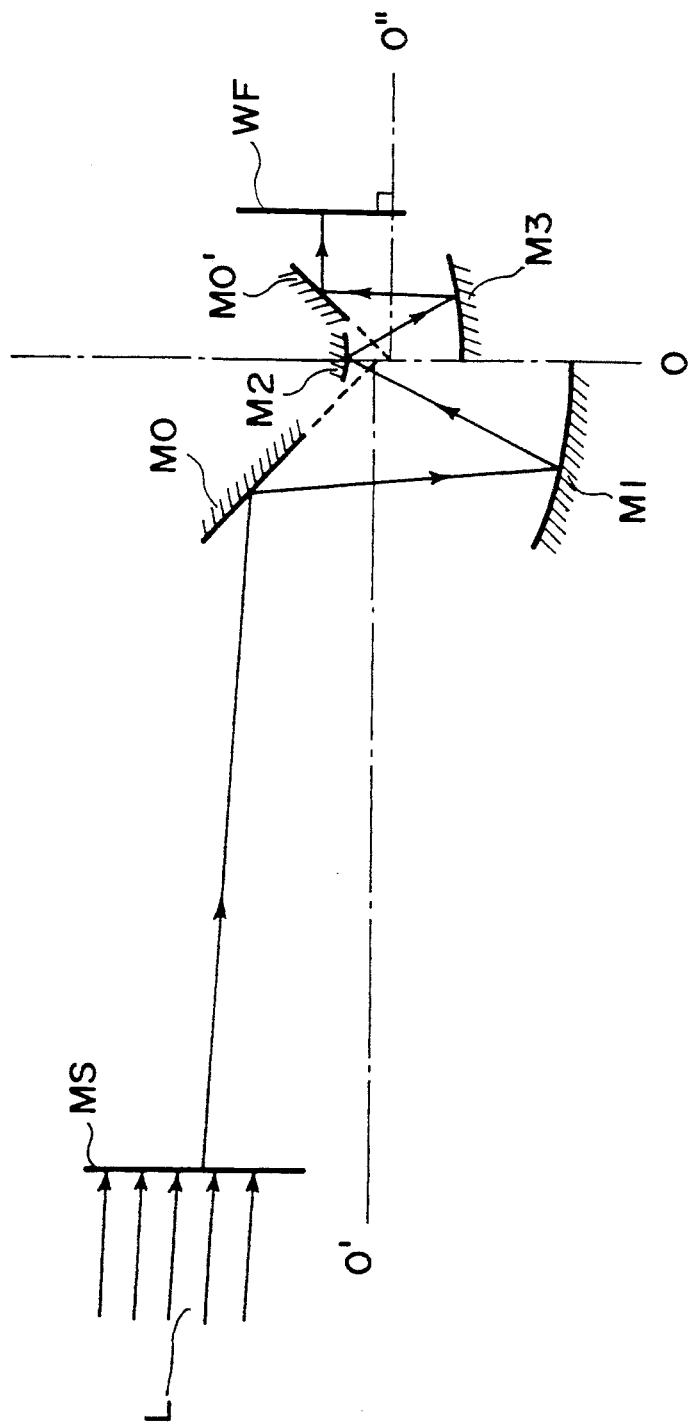
FIG. 13 shows an arrangement of an imaging system according to a sixth embodiment of the present invention wherein a mask and a wafer are arranged parallel to each other and vertically, and the wafer is stepwisely moved while being exposed to a pattern.

FIG. 13 shows a system arrangement of an X-ray reduction projection imaging system of a reflection type which is small in size, according to a sixth embodiment of the present invention. In this system, the mask MS and the wafer WF are disposed vertically and parallel to each other, wherein the illumination rays are still unblocked. Therefore, this arrangement is suitable to the apparatus wherein the wafer is moved stepwisely to expose plural shot areas of the wafer.

EMBODIMENT 7

FIG. 14 shows a general arrangement of an exposure apparatus according to a seventh embodiment of the present invention.

In the exposure apparatus, the mask MS is disposed vertically so as to suitably meet the SOR source. The wafer WF is supported on a horizontal stage, and as to the imaging system, the reflection imaging system of FIG. 9, 11 or 12 can be used.

A mask stage MS for supporting the mask MS is movable in two dimensions by an unshown driving device. The mask stage 1 is provided thereon with alignment marks 2A, 2B and 2C, which are exposed at different three positions on the mask stage 1 as shown in the Figure in this embodiment. The alignment marks are used to detect the degree of perpendicularity between the mask MS and the wafer WF and/or the wafer stage. The apparatus comprises a conduit tube in which the X-ray passes and which is effective to direct the X-ray emitted from an unshown X-ray source and having passed through the mask MS to a projection imaging system which will be described hereinafter. A barrel 4 for accommodating the projection imaging system comprising a plurality of reflecting mirrors is connected with the conduit tube 3. First, second and third stage alignment scopes 10, 11 and 12 are effective to observe the alignment marks 2A, 2B and 2C and alignment marks 6A, 6B and 6C on the member 50, respectively superimposedly.

First and second mask-wafer alignment scopes 20 and 21 function to detect alignment or deviation between the mask MS and the wafer WF to impart a relative movement between the mask MS and the wafer WF using the corresponding alignment marks on the mask MS and the wafer WF. The system comprises the above-described multi-layer film reflecting mirrors M0, M1, M2 and M3. Of these mirrors, the mirrors M1, M2 and M3 constitute a reduction projection imaging system; and the reflection mirror M0 serves to fold the X-ray introduced into the barrel 4 through the conduit tube 3 from the inlet port thereof to the reflecting mirror M1 at a predetermined angle.

Since only one half, with respect to the system axis O, of the reflecting mirror M1 is used as shown in FIGS. 1 and 4, the remaining half is not necessary in principle. However, the remaining half is preferably not removed from the standpoint of facilitating using tools when the multi-layer film is produced and for promoting thermal radiation. It is possible that the entire spherical mirror surface is coated with the multi-layer film, and only one half thereof is used. The reflecting mirror M3 is provided with an opening h1 for allowing passage of the X-ray at an eccentric position. The opening h1 is formed prior to the multi-layer film treatment, and is plugged by a material, under which condition the multi-layer film is formed. After the completion of the multi-layer film treatment, the material filling the opening is removed. By doing so, the distortion which may otherwise be produced during the machining of the opening can be avoided. The reflecting mirror M2 is securely fixed onto a supporting plate SS having the opening h2.

Members 50, 51 and 52 are stage constituent members for constituting a wafer stage. The constituent member 50 is provided with a wafer chuck for securely supporting the wafer WF. The top surface of the constituent member 50 is provided with stage alignment mark 6A, 6B and 6C for alignment operation. The constituent member 51 carries the constituent member 50 and is movable on the constituent member 52 in the X direction as shown in the Figure. The constituent member 52 is movable in the Y direction as indicated in the Figure, so that the constituent members 51 and 52 constitute a so-called X-Y stage. To drive the constituent members 51 and 52 in the X direction and Y direction, respectively, driving devices 70 and 71 are provided, which include step motors respectively. The constituent member 50 is rotatable in the $\theta$ direction by an unshown driving device. The constituent member 50 is vertically movable by piezoelectric elements P1, P2 and P3 disposed therebelow as shown in FIG. 15. Distance meters 90, 91 and 92 for controlling the stage are provided to detect the position and movement amount of the wafer in the X and Y directions with high precision. As for the distance meters 90, 91 and 92, a non-contact type (optical type) such as an interferometer type is preferable.

The projection exposure apparatus shown in FIG. 14 is such that an image of the pattern of the mask MS is projected as a plane projection onto the wafer by forming a reduced image thereof by the reflecting mirror M1, M2 and M3, and the exposure is effected for each of chips or for a group of plural chips defined by scribe lines on the wafer WF, that is, in a so-called step-and-repeat fashion. The mask MS is supported by an unshown mask holder on the mask stage 1, while the wafer WF is attached on an unshown wafer chuck. After completion of an alignment operation between the wafer WF and the mask MS which will be described hereinafter, the exposure operation is executed in the following manner.

The X-ray emitted from the unshown X-ray source illuminates the mask MS, and the circuit pattern of the mask MS is formed on the wafer WF in a predetermined region through the conduit tube 3, the reflection mirror M0 and a reduction projection system comprising reflecting mirrors M1, M2 and M3. In this apparatus, the information representative of the circuit pattern of the mask MS is transmitted onto the wafer WF in the form of a strength distribution of an X-ray, and a latent image of a circuit pattern is formed in the photosensitive material (resist) for the X-ray applied on the surface of the wafer WF. The wavelength range of the used X-ray may be selected in harmonization with the properties of the photosensitive layer and the projection system. If the X-ray source is not available which produces the desired wavelength range, the mask MS may be illuminated through an X-ray filter having a desired absorption property, such as BN (boron nitride). After completion of one shot exposure for one chip or a group of chips, the wafer stage is moved stepwisely by the driving devices 70 and 71 so as co place the adjacent chip or group of chips to the effective exposure region, and then, the mask MS and the chip of the wafer WF to be exposed are aligned again, whereafter the chip or the group of the chip are exposed to the X-ray pattern (repeat). These operations are executed in a predetermined order for plural chips on the wafer WF, and all the chips defined by scribe lines on the wafer WF are exposed to the pattern by the plural shots of exposure. The wafer WF which has been exposed entirely, is automatically replaced with an unexposed wafer WF, and the above-described process is repeated.

Now, an example of alignment operation will be described.

In FIG. 14, the driving devices 70 and 71 drive the wafer stage comprising the constituent members 50, 51 and 52, so that the alignment marks 6A, 6B and 6C on the constituent member 50 can be sequentially observed by stage alignment scopes 10, 11 and 12 through the projection imaging system including the reflecting mirror M1, M2 and M3.

More particularly, a semiconductor laser head LZ mounted to the bottom face of the supporting plate SS is actuated to emit light. Then, the stage is driven so as to face the alignment mark 6A on the wafer stage to the opening h2. The focus detection is effected between the alignment mark 2A on the mask stage 1 and the alignment mark 6A on the wafer stage using the alignment scope 12. At this time, the wafer stage is driven vertically to provide a focused stage by the piezoelectric element P1. Similarly, the marks 6B and 6C are sequentially faced to the opening h2, the focus condition is detected using the marks 2B and 2C and alignment scopes 11 and 10, and the piezoelectric elements P2 and P3 are actuated so as to vertically move the wafer stage. By these operations, the respective distances between three marks 2A, 2B and 2C and three marks 6A, 6B and 6C are adjusted to a focused state. As a result, the degree of perpendicularity between the mask stage and the wafer stage are assured. Immediately after each of the focused state detections, the X and Y direction deviations are sequentially measured and memorized using the marks 2A, 2B and 2C and the marks 6A, 6B and 6C. It is possible that the correcting drive may be executed using the motors 70 and 71.

Since the distance between the mask MS and the wafer WF is long in this embodiment, the perpendicularity correction is advantageous between the mask MS and the wafer WF. In the similar manner, the mask MS and the wafer WF are adjusted to be parallel to each other in the imaging systems shown in FIGS. 1, 4, 8 and 13. Since the alignment marks 6A, 6B and 6C on the wafer stage are detected by the beam inversely travelling the reduction imaging system, and therefore, if the reduction is 1/5, the alignment marks 6A, 6B and 6C can be detected in an enlarged scale, that is 5 times.

The information regarding the alignment from the alignment scopes 10, 11 and 12 can be obtained visually or photo-electrically. For this purpose, any of known methods may be used.

If a positional relationship is predetermined between such an area of the exposure region of the wafer WF retained on the constituent member 50 that is to be exposed to the pattern by a first shot (for example, the area for a first chip defined by orthogonal scribe lines) and the alignment marks 6A, 6B and 6C, the wafer stage including the constituent members 50, 51 and 52 are moved, after the above described stage alignment operation, on the basis of the predetermined positional relationship so that the first shot area on the wafer WF is brought to the neighborhood of the image area of the projection imaging system where the pattern of the mask MS is formed. At the marginal area of the first shot exposure area on the wafer WF, more particularly in the scribe lines, a predetermined couple of alignment marks is formed. These alignment marks and unshown alignment marks on the mask MS are visually or photo-electrically detected using the mask-wafer alignment scopes 20 and 21, so that a further highly accurate alignment can be exposed.

The semiconductor laser head LZ functioning as the light source for the alignment produces light has a wavelength of for example 780 nm-850 nm. It is noted that this wavelength is longer than the wavelength of 100 angstroms of the exposure X-ray by 1-2 orders. The reflecting surfaces of the multi-layer film reflecting mirror can effectively reflect the laser beam as by a simple metal layer reflecting surface. Further, the alignment marks on the wafer stage or the wafer WF are observed in an enlarged scale, for example, 5 times, if the reduction ratio of the reduction reflection system is 1/5, since the light travels inversely by way of the reflecting mirrors M3, M2 and M1 toward the mask MS.

Even if two wavelengths, for example 780 nm and 850 nm of the laser produced by the semiconductor laser are used for two kinds of resists, for example, the reflecting mirror does not essentially exhibit wavelength dependence on the wavelength of this order. Therefore, a highly accurate alignment can be maintained which is preferable.

After completion of the above described alignment, the exposure step which has been described hereinbefore starts. If the positional relationship between the first shot area and the subsequent step-and-repeat areas, and the sequence of the exposures are stored in an unshown control device, the movement to the next shot area subsequent to the first shot can be performed through the control device to move the wafer stage with high precision (step movement) without the alignment operation between the mask MS and the wafer WF for each shot. Particularly from the standpoint of improvement in the throughput, the system wherein the alignment operation is carried out only for the first shot, and the subsequent stepwise movement for the remaining shots are effected, trusting the mechanical accuracy of the stage is more preferable than a die-by-die alignment the alignment, is performed between the mask MS and the wafer WF for each of the shots.

The inside of the projection exposure apparatus shown in FIG. 14 is evacuated since the X-ray is used for the exposure. For example, evacuating means such as a vacuum pump (not shown) is used to evacuate it to such an extent of vacuum of $10^{-6}$ Torr. The degree of vacuum in the apparatus is preferably higher, and in this embodiment, the exposure is performed under a high vacuum or a ultra high vacuum condition. For this purpose, the above described reflecting mirror cooling means is advantageous.

In place of maintaining the vacuum in the apparatus, the air in the apparatus containing $N_2$ and $O_2$ and others is replaced by light elements such as hydrogen, H, and/or helium, He, so as to fill the inside of the apparatus with light element or elements for the exposure of X-rays. For example, the front side (X-ray receiving side) of the mask MS in FIG. 14 and the backside thereof (inside the barrel 3) and the upper surface of the wafer WF are all covered and filled with He flowing at a constant speed. Then, those light elements hardly absorb the X-ray, while on the other hand, they exhibit better heat absorption than the vacuum, so that the mask MS and the reflecting mirror are protected from distortion due to heat. If the exposure operation is carried out under such conditions, the number of X-ray transmitting window covered by beryllium can be minimized so as to minimize the attenuation of the X-ray energy, in other words, to efficiently use the X-ray. If, on the other hand, the upper portion of the mask MS is in a He chamber, the lower barrel 3 is a vacuum chamber, and the upper portion of the wafer is in an air chamber, the Be window is required for each of the boundaries, resulting in large attenuation of the X-ray energy. Since H is very easy to burn, He is better from the standpoint of safety. Even when the He is used, the mirror or mirrors may be provided with forced cooling means.

When the wavelength of the X-ray used for the exposure is large, the X-ray is easily absorbed by various materials, and therefore the possibility of influence on the human body or the like is very small, and a X-rays hardly leak externally by employing the shield for maintaining the vacuum. On the other hand, with the decrease of the wavelength of the X-ray, the absorption thereof by various materials becomes smaller, and therefore, it is preferable to provide a shield for the X-ray as the case may be, depending on the wavelength of the X-ray used.

As described in the foregoing, according to the projection exposure apparatus shown in FIG. 14, a pattern of the mask illuminated by the X-rays is imaged on the wafer by way of the projection imaging system to expose the wafer to the pattern, and the projection imaging system formed the image in a reduced scale, so that the precision required for the mask pattern is eased as compared with the conventional proximity method, thus making the manufacturing of the mask easier. Additionally, the reduction projection enhances resolution. Also, the latitude to the usable X-ray source is increased, so that applicability is enhanced. Furthermore, the necessity of the accurate gap measurement between the mask and the wafer which is needed in the proximity method and for the adjustment of the gap is eliminated.

The X-ray mask usable with the present invention may be of a transparent type or a reflection type. The transparent type X-ray mask includes an X-ray absorbing portion and a mask substrate for supporting the X-ray absorbing portion, the X-ray absorbing portion forming a pattern on the mask substrate. The X-ray absorbing portion may be of Au, Pa, W or the like which exhibit high X-ray absorbing rate and which is easy to process. As for the material of the mask substrate, organic high molecular materials and inorganic materials are usable. For the former, there are polyimide, Myler and Kapton and as to the latter, there are Si, Bn, Ti, $Si_3N_4$, SiC and Si in which B is dispersed. Also, SiN substrate and a compound substrate of polyimide and Bn are usable.

The reflection type X-ray mask includes a mask substrate having low reflectivity on which a pattern is drawn with high reflectivity material. For example, on a thick mask substrate of a low electron density material (light element substance) such as Si or the like, a pattern is drawn by high electron density material (heavy element substance) such as Au or the like, or as another example, a multi-layer reflecting film including Ti and Ni is patterned on a mask substrate.

The mask MS to be used with the present invention is required to be selected depending on the wavelength of the X-ray used. For example, if the wavelength of the X-ray to be used is several angstroms to several tens of angstroms, the material of the mask may be selected from the above-described. However, if the wavelength is relatively long, for example, several tens of angstrom to several hundreds of angstroms, the above-described materials are not preferable since they absorb much X-ray energy. For the masks for the long wavelength X-rays, several tens of angstroms to several hundreds of angstroms, through openings are formed in the X-ray absorbing member and reflecting member in accordance with the circuit pattern, that constitute a mask.

As for the X-ray source usable with the present invention, the following may be used a conventional X-ray source of so-called electron beam excitation type wherein an electron beam is applied to a solid metal to produce X-rays, an X-ray source utilizing laser plasma, rare gas plasma, creeping discharge plasma or a source utilizing synchrotron radiation represented by SOR (synchrotron orbital radiation).

The X-ray sensitive material used for the exposure, that is, the resist, can be selected from a wide range of materials from high sensitivity to relatively low sensitivity materials depending on the energy density of the exposure X-ray which is different is the X-ray if different.

As examples of negative type X-ray resist material, there are polyglycidylmethacrylate-CO-ethylacrylate (COP, maleic acid added polyglycidylmethacrylate (SEL-N), polydiallylorthophthalate, epoxidized polybutadiene, polystyrene TIF, metallic salt containing resist material, halogen containing polyvinyl ether resist material and halogen containing polyacrylate resist material. As examples of positive type X-ray resist materials, there are polymethyl methacrylate (PMMA), polyhexafluorobutylmethacrylate, polytetrafluoropropylmethacrylate, polmethacrylonitrile, poly(MMA-CO-trichloroethylmethacrylate), polybutene-1-sulfone, metallic acid containing resist material, polytrichloromethacrylate, polymethylmethacrylate-CO-dimethylmethylenemalonate (PMA-CO-DMM), copolymer of n-hexyl aldehyde and n-butyl aldehyde, and polychloroacetaldehyde.

As described in the foregoing, according to the present invention, the loss of the X-ray energy by the mirror surfaces and the distortion of the reflecting mirror by heat can be minimized, and therefore, the exposure pattern transfer can be performed efficiently and with high resolution.

While the invention has been described with reference to the structures disclosed herein, it is not confined to the details set forth and this application is intended to cover such modifications or changes as may come within the purposes of the improvements or the scope of the following claims.

What is claimed is:

1. An X-ray exposure apparatus, comprising:
a mask stage for holding a mask having a pattern for circuit manufacturing;
a wafer stage for holding a wafer to be exposed to the pattern of the mask with X-rays; and
a reflection reduction imaging system disposed between said mask stage and said wafer stage comprising a reflecting mirror arrangement comprising at least three, but not more than five, reflecting mirrors coated with multi-layer films for receiving X-rays from the mask and directing them to the wafer to expose the wafer to a reduced image of the mask pattern with the X-rays;
wherein at least one of the reflecting mirrors is provided with an aspherical reflecting surface.

2. An apparatus according to claim 1, further including forced cooling means for cooling at least one of the reflecting mirrors.

3. An apparatus according to claim 1, wherein a space between at least two reflecting mirrors is filled with helium gas.

4. An X-ray exposure apparatus, comprising:
a mask stage for holding a mask having a pattern for circuit manufacturing;
a wafer stage for holding a wafer to be exposed to the pattern of the mask with X-rays; and
a reflection reduction imaging system disposed between said mask stage and said wafer stage including a reflecting mirror arrangement containing at least one flat mirror and a plurality of non-flat mirrors, each of which mirrors are coated with multi-layer films, for receiving X-rays from the mask and directing them to the wafer to expose the wafer to a reduced image of the mask pattern with the X-rays.

5. An apparatus according to claim 4, wherein at least one of the non-flat reflecting mirrors is provided with an aspherical reflecting surface.

6. An apparatus according to claim 4, further including cooling means for cooling at least one of the reflecting mirrors.

7. An apparatus according to claim 4, wherein a space between at least two reflecting mirrors is filled with helium gas.

8. An X-ray exposure apparatus, comprising:
a mask stage for holding a mask having a pattern for circuit manufacturing;
a wafer stage for holding a wafer to be exposed to the pattern of the mask with X-rays; and
a reflection reduction imaging system disposed between said mask stage and said wafer stage including a reflecting mirror arrangement containing plural multi-layer film coated reflecting mirrors, at least one of which is provided with forced cooling means, for receiving X-rays from the mask and directing them to the wafer to expose the wafer to a reduced image of the mask pattern with the X-rays.

9. An apparatus according to claim 8, wherein at least one of the reflecting mirrors is provided with an aspherical reflecting surface.

10. An apparatus according to claim 8, wherein at least two reflecting mirrors nearest the mask stage are provided with forced cooling means.

11. An apparatus according to claim 8, wherein helium gas flows in a space between at least two of the reflecting mirrors.

12. An X-ray exposure apparatus, comprising:
a mask stage for holding a mask having a pattern for circuit manufacturing;
a wafer stage for holding a wafer to be exposed to the pattern of the mask with X-rays;
a reflection reduction imaging system disposed between said mask stage and said wafer stage including a reflecting mirror arrangement containing a plurality of reflecting mirrors coated with multi-layer films for receiving X-rays from the mask and directing them to the wafer to expose the wafer to a reduced image of the mask pattern with the X-rays; and
wherein helium gas flows through a space between at least two of said reflecting mirrors.

13. An apparatus according to claim 12, wherein at least one of the reflecting mirrors is provided with an aspherical reflecting surface.

14. An apparatus according to claim 12, further including cooling means for cooling at least one of the reflecting mirrors.

15. An X-ray exposure apparatus, comprising:

a mask stage for holding a mask having a pattern for circuit manufacturing;

a wafer stage for holding a wafer to be exposed to the pattern of the mask with X-rays;

means for forcingly cooling the mask; and a reflection reduction imaging system disposed between said mask stage and said wafer stage including a reflecting mirror arrangement containing a plurality of reflecting mirrors coated with multi-layer films for receiving X-rays from the mask and directing them to the wafer to expose the wafer to a reduced image of the mask pattern with the X-rays.

16. An apparatus according to claim 15, wherein at least one of said reflecting mirrors has an aspherical reflecting surface.

17. An apparatus according to claim 15, wherein at least one of said reflecting mirrors is provided with forced cooling means.

18. An apparatus according to claim 15, wherein helium gas flows through a space between at least two of the reflecting mirrors.

19. An X-ray reduction exposure apparatus, comprising:

a mask stage for holding a mask having a pattern for circuit manufacturing;

a wafer stage for holding a wafer to be exposed to the pattern of the mask;

a reflection reduction imaging system disposed between said mask stage and said wafer stage including a reflecting mirror arrangement containing a plurality of reflecting mirrors which are coated with multi-layer films, at least one of the plurality of reflecting mirrors having an aspherical reflecting surface, said reflection reduction imaging system for exposing the wafer to a reduced image of the mask pattern in a rectangular area; and means for stepwisely moving said wafer stage to sequentially expose areas on the wafer having a configuration corresponding to the rectangular area.

20. An apparatus according to claim 19, wherein said rectangular area is oblong.

21. An apparatus according to claim 19, wherein the wafer is exposed to the reduced image of the mask pattern with X-rays.

22. An X-ray reduction exposure apparatus, comprising:

a mask stage for holding a mask having a pattern for circuit manufacturing;

a wafer stage for holding a wafer to be exposed to the pattern of the mask with X-rays;

plural reflecting mirrors for reflecting X-rays, disposed between said mask stage and said wafer stage, to expose the wafer to a reduced image of the mask pattern; and means for detecting a mark on said wafer stage in an enlarged scale using visible light coming from the wafer by way of said reflecting mirrors in a direction opposite to a direction of travel of the X-rays for exposing the wafer, whereby the mark can be detected substantially free from aberration.

23. An apparatus according to claim 22, wherein at least one of said plural mirrors is provided with a multi-layer film coating.

24. An apparatus according to claim 22, wherein at least one of said plural mirrors has an aspherical reflecting surface.

25. An apparatus according to claim 22, wherein the visible light is a laser beam.

26. A reduction exposure apparatus, comprising:

a mask stage for vertically holding a mask having a pattern for circuit manufacturing;

a synchrotron orbital radiation source for producing energy rays for application of the rays to the mask;

a wafer stage for horizontally holding a wafer to be exposed to the pattern of the mask with the rays; and reduction imaging means disposed between the mask and the wafer for exposing the wafer to a reduced image of the mask pattern, said imaging means comprising a plurality of reflecting mirrors, at least one of the reflecting mirrors having an aspherical reflecting surface and at least one of the reflecting mirrors being coated with a multi-layer film; and means for sequentially moving said wafer stage for sequentially exposing plural exposure areas of the wafer to the reduced image of the mask pattern.

27. An X-ray reflecting imaging system, comprising:

a first concave mirror having a multi-layer film reflecting surface; and a second concave mirror having a multi-layer reflecting film for receiving X-rays from said first concave mirror, said second concave mirror having an opening eccentric with respect to an axis of the imaging system for allowing the X-rays to pass through said second concave mirror.

28. A system according to claim 27, wherein said first concave mirror is provided with forced cooling means.

29. A system according to claim 27, wherein a space between said first and second concave mirrors is filled with helium gas.

30. An X-ray reflecting imaging system, comprising:

a first mirror having a concave reflecting surface for reflecting X-rays from an object;

a second mirror having a convex reflecting surface for receiving the X-rays from said first mirror and reflecting them;

a third mirror having a concave reflecting surface for receiving the X-rays from said second convex mirror and reflecting them to form an image of the object; and wherein the reflecting surface of at least one of said first and third concave mirrors is aspherical, whereby an image formed by the X-rays involves minimized aberrations; and wherein the reflecting surface of at least one of said mirrors is provided with a multi-layer coating.

31. A system according to claim 30, wherein each of said mirrors are provided with multi-layer coatings.

32. A system according to claim 30, wherein the minimized aberrations are maintained within an area in a rectangular form.

33. A system according to claim 30 wherein said imaging system is a reduction imaging system.

34. A system according to claim 30, wherein said imaging system is used as an enlarging imaging system.

35. A system for producing an image of an object using X-rays, said system comprising:

imaging means provided between the object and a plane on which the image thereof is produced for receiving and reflecting X-rays, said imaging means comprising a plurality of X-ray reflecting elements provided with multi-layer coatings; and X-ray application means for applying the X-rays to the object inclinedly with respect to a surface of the object to cause the X-rays incident on the plane to be substantially parallel to a system axis of said imaging means.

36. A system according to claim 35, wherein the object and the plane are located on opposite sides of the system axis.

37. A system according to claim 35, wherein a position of a front focus of said imaging means is coincident with a position of an entrance pupil.

38. An X-ray projection exposure apparatus for exposing a member sensitive to X-rays to a reduced image of a mask pattern with the X-rays, said apparatus comprising:
an inlet port for receiving X-rays travelling substantially in a horizontal direction;
a mask holder for holding a mask substantially vertically for the mask to receive the X-rays through said inlet port;
a first mirror for receiving the X-rays coming from the mask and reflecting them in a substantially vertical direction;
a second mirror disposed above said first mirror having a bottom curved reflecting surface for receiving the X-rays from the first mirror and reflecting them;
a third mirror disposed below said first mirror having a top curved reflecting surface for receiving the X-rays coming from said second mirror and reflecting them;
a fourth mirror disposed between said first and second mirrors having a bottom curved reflecting surface for receiving the X-rays from said third mirror and reflecting them substantially vertically; and
a holder for holding the sensitive member substantially horizontally for the sensitive member to receive the X-rays from the fourth mirror.

39. An apparatus according to claim 38, wherein said second, third and fourth mirrors are optically coaxial.

40. An apparatus according to claim 39, wherein said first mirror is eccentric from a coaxis of said second, third and fourth mirrors.

41. An apparatus according to claim 38, wherein said third mirror has an eccentric opening for allowing the X-rays reflected by said fourth mirror to pass through said third mirror.

42. An apparatus according to claim 38, wherein said fourth mirror has an eccentric opening to allow the X-rays toward and away from said second mirror to pass through said fourth mirror.

43. An apparatus according to claim 38, wherein said holder, stage allows the X-rays to pass therethrough, so that the mask, which is of a transmitting type, is usable.

44. An apparatus according to claim 38, wherein said mask holder is disposed between said inlet port and said first mirror.

45. An apparatus according to claim 38, wherein said inlet port and said first mirror face a same side of the mask holder, so that the mask, which is of a reflection type, is usable.

46. An X-ray exposure apparatus, comprising:
a mask stage for holding a mask having a pattern for circuit manufacturing;
a wafer stage for holding a wafer to be exposed to the pattern of the mask with X-rays; and
a reflection reduction imaging system disposed between said mask stage and said wafer stage comprising reflecting mirrors coated with multi-layer films for receiving X-rays from the mask and directing them to the wafer to expose the wafer to a reduced image of the mask pattern with the X-rays;
wherein at least one of the reflecting mirrors is provided with an aspherical reflecting surface.

47. A system according to claim 35, wherein the image is produced by only one side of at least one of said reflecting elements.

48. An X-ray exposure apparatus comprising:
an original supporting stage for supporting an original;
a substrate supporting stage for supporting a substrate; and
a mirror assembly for projecting an image of a pattern of the original onto the substrate using X-rays, said mirror assembly comprising at least three mirrors each having curved reflecting surfaces and at least one of which has an aspherical reflection surface.

49. An apparatus according to claim 48, further comprising an illumination system for illuminating the original to project the image onto the substrate.

50. An apparatus according to claim 49, wherein said illumination system comprises a radiation source for emitting X-rays to illuminate the original.

51. An apparatus according to claim 50, wherein said mirror assembly comprises means for forming the image with X-rays reflected by the original.

52. An apparatus according to claim 50, wherein said mirror assembly comprises means for forming a reduced image of the pattern.

53. An apparatus according to claim 52, wherein said mirror assembly comprises a first concave mirror having a radius of curvature r1 with respect to its optical axis, a convex mirror having a radius of curvature r2 with respect to its optical axis and a second concave mirror having a radius of curvature R3 with respect to its optical axis, said mirrors being disposed in the named order from said illumination system, so that the conditions $0.9 < r2/r1 + r2/r3 < 1.1$ are satisfied.

54. An apparatus according to claim 50, wherein said mirror assembly comprises a plurality of mirrors having multi-layer coating reflection surfaces.

55. A method of manufacturing a semiconductor device, said method comprising:
providing a mirror assembly including at least three mirrors each having curved reflecting surfaces and at least one of which has an aspherical mirror surface; and
projecting an image of a pattern of an original onto a substrate through the mirror assembly to transfer the pattern onto the substrate using X-rays.

56. A method according to claim 55, further comprising illuminating the original with X-rays from an illumination system, receiving the X-rays through the original by the mirror assembly and forming the image by the X-rays.

57. A method according to claim 56, further comprising providing the mirror assembly with a plurality of mirrors, at least one of the plurality of mirrors being provided with the aspherical reflection surface.

58. A method according to claim 57, further comprising providing the plurality of mirrors of the assembly with multi-layer coating reflection surfaces.

59. A method according to claim 57, further comprising providing the mirror assembly with a first concave mirror having a radius of curvature r1 with respect to its optical axis, a convex mirror having a radius of curvature r2 with respect to its optical axis and a second concave mirror having a radius of curvature r3 with respect to its optical axis, the mirrors being disposed in the named order from the illumination system, so that the conditions $0.9 < r2/r1 + r2/r3 < 1.1$ are satisfied.

60. A method according to claim 56, further comprising forming a reduced image of the pattern by the mirror assembly.

61. A method according to claim 56, further comprising supplying the X-rays from a synchrotron radiation source.

62. A pattern transfer apparatus comprising:
an original holder for holding an original having a pattern;
a substrate holder for holding a substrate having plural areas;
a projection system for projecting the pattern of the original onto an area of the substrate in a reduced scale, said projection system comprising a plurality of reflecting mirrors, wherein at least one of said mirrors has an aspherical reflection surface; and
means for moving said substrate holder to sequentially transfer the pattern onto the areas of the substrate.

63. An apparatus according to claim 62, wherein said projection system comprises at least three curved reflection surface mirrors.

64. A pattern transfer apparatus comprising:
an original holder for holding an original having a pattern;
a substrate holder for holding a substrate having plural areas;
a projection system for projecting the pattern of the original onto an area of the substrate, said projection system comprising a plurality of reflecting mirrors, wherein at least one of said mirrors has an aspherical reflection surface; and
means for moving said substrate holder to sequentially transfer the pattern onto the areas of the substrate.

65. An apparatus according to claim 64, wherein said projection system comprises at least three curved reflection surface mirrors.

66. A pattern transfer apparatus comprising:
an original holder for holding an original having a pattern;
substrate holder for holding a substrate having plural areas;
a projection system for projecting the pattern of the original onto an area of the substrate in a reduced scale, said projection system comprising at least three curved reflection surface mirrors, wherein at least one of said mirrors has an aspherical reflection surface; and
means for moving said substrate holder to sequentially transfer the pattern onto the areas of the substrate.

67. A semiconductor manufacturing method comprising:
holding an original having a pattern;
holding a substrate having plural areas with a substrate holder;
projecting the pattern of the original onto an area of the substrate in a reduced scale using a projection system having a plurality of reflecting mirrors, wherein at least one of the mirrors has an aspherical reflection surface; and
moving the substrate holder to sequentially transfer the pattern onto the areas of the substrate.

68. A method according to claim 67, further comprising providing the projection system with at least three curved reflection surface mirrors.

69. A semiconductor manufacturing method comprising:
holding an original having a pattern;
holding a substrate having plural areas with a substrate holder;
projecting the pattern of the original onto an area of the substrate using a projection system having a plurality of reflecting mirrors, wherein at least one of the mirrors has an aspherical reflection surface; and
moving the substrate holder to sequentially transfer the pattern onto the areas of the substrate.

70. A method according to claim 69, further comprising providing the projection system with at least three curved reflection surface mirrors.

71. A semiconductor manufacturing method comprising:
holding an original having a pattern;
holding a substrate having plural areas with a substrate holder;
projecting the pattern of the original onto an area of the substrate in a reduced scale using a projection system having at least three reflection surface mirrors, wherein at least one of the mirrors has an aspherical reflection surface; and
moving the substrate holder to sequentially transfer the pattern onto the areas of the substrate.

* * * * *

UNITED STATES PATENT AND TRADEMARK OFFICE
CERTIFICATE OF CORRECTION

PATENT NO. : 5,153,898   Page 1 of 3
DATED : October 6, 1992
INVENTOR(S) : Masayuki Suzuki, et al.

It is certified that error appears in the above-identified patent and that said Letters Patent is hereby corrected as shown below:

ON THE COVER PAGE

UNDER "OTHER PUBLICATIONS"

" "Melium cooling " should read --Helium cooling--.

IN THE DRAWINGS

Fig. 6, "AS TIGMATISM" should read --ASTIGMATISM-- and DIST ORTION" should read --DISTORTION--.

COLUMN 2

Line 63, "stepwisely" should read --stepwise--.

COLUMN 4

Line 68, "blurrness" should read --blurriness--.

COLUMN 5

Line 1, "blurrness" should read --blurriness--;
Line 31, "blurrness" should read --blurriness--;
Line 48, "image" should read --image height; $Y_{min}$, a minimum image height. Usually, the--; and
Line 49, should be deleted.

UNITED STATES PATENT AND TRADEMARK OFFICE
CERTIFICATE OF CORRECTION

PATENT NO. : 5,153,898

DATED : October 6, 1992

INVENTOR(S) : Masayuki Suzuki, et al.

Page 2 of 3

It is certified that error appears in the above-identified patent and that said Letters Patent is hereby corrected as shown below:

COLUMN 6

Line 19, "paradium Pd" should read --palladium Pd-- and "thodium Rh" should read --rhodium Rh--.

COLUMN 10

Line 58, "has" should read --have-- and "have" should read --have a--.

COLUMN 11

Line 22, "saggital" should read --sagittal--;
Line 37, "a" should read --an--; and
Line 66, "stepwisely" should read --stepwise--.

COLUMN 15

Line 55, "co" should read --to--.

COLUMN 16

Line 26, "are" should read --is--; and
Line 68, "has" should read --having--.

UNITED STATES PATENT AND TRADEMARK OFFICE
CERTIFICATE OF CORRECTION

PATENT NO. : 5,153,898
DATED : October 6, 1992
INVENTOR(S) : Masayuki Suzuki, et al.

It is certified that error appears in the above-identified patent and that said Letters Patent is hereby corrected as shown below:

COLUMN 17

Line 35, "ment the alignment, is performed" should read --ment, the alignment is performed--.

COLUMN 19

Line 27, "polmethacrylonitrile," should read --polymethacrylonitrile,--.

COLUMN 23

Line 52, "holder, stage" should read --mask holder--.

COLUMN 24

Line 36, "radius of curvature R3" should read --radius of curvature r3--.

Signed and Sealed this

Seventh Day of December, 1993

Attest:

BRUCE LEHMAN

Attesting Officer

Commissioner of Patents and Trademarks